(12) United States Patent
Hashimoto et al.

(10) Patent No.: US 10,283,670 B2
(45) Date of Patent: May 7, 2019

(54) METHOD FOR MANUFACTURING LIGHT EMITTING DEVICE

(71) Applicant: NICHIA CORPORATION, Anan-shi (JP)

(72) Inventors: Toru Hashimoto, Tokushima (JP); Yukihiro Shibano, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 19 days.

(21) Appl. No.: 15/252,219

(22) Filed: Aug. 31, 2016

(65) Prior Publication Data

US 2017/0062671 A1    Mar. 2, 2017

(30) Foreign Application Priority Data

Aug. 31, 2015 (JP) ................................. 2015-170401

(51) Int. Cl.
    *H01L 33/50*      (2010.01)
    *H01L 33/00*      (2010.01)
    (Continued)

(52) U.S. Cl.
    CPC .......... *H01L 33/005* (2013.01); *H01L 33/505* (2013.01); *H01L 33/54* (2013.01);
    (Continued)

(58) Field of Classification Search
    CPC ..... H01L 33/50–508; H01L 2933/0041; H01L 2933/005; H01L 2933/0058; H01L 2933/0025; H01L 51/56
    See application file for complete search history.

(56) References Cited

U.S. PATENT DOCUMENTS

| | | |
|---|---|---|
| 2009/0086449 A1 | 4/2009 | Minamio et al. |
| 2012/0256215 A1 | 10/2012 | Liou et al. |

(Continued)

FOREIGN PATENT DOCUMENTS

| | | |
|---|---|---|
| JP | 2009-081346 | 4/2009 |
| JP | 4944269 B1 | 5/2012 |

(Continued)

OTHER PUBLICATIONS

Machine translation of JP 2012227470A, translated Jan. 5, 2018.*

*Primary Examiner* — Lauren R Bell
(74) *Attorney, Agent, or Firm* — Mori & Ward, LLP

(57) ABSTRACT

A soluble member is provided on a light emitting surface of a light emitting element. The soluble member is soluble in a solvent. The soluble member has a first surface facing the light emitting surface, a second surface opposite to the first surface in the light emitting direction, and a soluble member outer peripheral side surface provided between the first surface and the second surface. A light-blocking member made of a material which is not soluble in the solvent is provided to cover a light emitting element outer peripheral side surface and the soluble member outer peripheral side surface so that an inner side wall of the light-blocking member contacts the soluble member outer peripheral side surface. The soluble member is removed using the solvent to provide a recess surrounded by the inner side wall of the light-blocking member. A first light-transmissive member is provided in the recess.

10 Claims, 13 Drawing Sheets

(51) Int. Cl.
  *H01L 33/58* (2010.01)
  *H01L 33/60* (2010.01)
  *H01L 33/54* (2010.01)

(52) U.S. Cl.
  CPC .............. *H01L 33/58* (2013.01); *H01L 33/60* (2013.01); *H01L 2224/16225* (2013.01); *H01L 2224/97* (2013.01); *H01L 2933/0041* (2013.01); *H01L 2933/0058* (2013.01); *H01L 2933/0091* (2013.01)

(56) References Cited

U.S. PATENT DOCUMENTS

| | | |
|---|---|---|
| 2012/0261699 A1 | 10/2012 | Ooyabu et al. |
| 2015/0034985 A1* | 2/2015 | Tomizawa .............. H01L 33/62 257/98 |
| 2015/0207046 A1* | 7/2015 | Ikegami ................ H01L 33/508 257/98 |
| 2016/0163932 A1* | 6/2016 | Brandi .................. H01L 33/505 438/29 |

FOREIGN PATENT DOCUMENTS

| | | | |
|---|---|---|---|
| JP | 2012-222315 | | 11/2012 |
| JP | 2012227470 A | * | 11/2012 |
| JP | 2012-253223 | | 12/2012 |
| JP | 2012-253225 | | 12/2012 |
| JP | 2015-008329 | | 1/2015 |

* cited by examiner

METHOD FOR MANUFACTURING LIGHT EMITTING DEVICE

CROSS-REFERENCE TO RELATED APPLICATIONS

The present application claims priority under 35 U.S.C. § 119 to Japanese Patent Application No. 2015-170401, filed Aug. 31, 2015, entitled "Method for Manufacturing Light Emitting Device". The contents of this application are incorporated herein by reference in their entirety.

BACKGROUND

Technical Field

The present discloser relates to a method for manufacturing a light emitting device.

Discussion of the Background

Japanese Unexamined Patent Application Publication No. 2012-253225 discloses a light emitting device including a fluorescent layer and a reflective layer. The fluorescent material layer containing a light-transmissive resin and fluorescent material particles is disposed on an upper surface serving as a light extraction surface of a light emitting element. The reflective layer containing a light-reflective resin is disposed to cover a side surface of the light emitting element and a side surface of the fluorescent material layer. The light emitting device mixes light from the light emitting element with light obtained in such a manner that a part of the light from the light emitting element is subjected to wavelength conversion with the fluorescent material, and then emits the mixed light from an upper surface thereof.

Japanese Unexamined Patent Application Publication No. 2012-253225 also discloses a method for manufacturing the light emitting device, the method including: forming the fluorescent material layer on the light extraction surface of the light emitting element; singulating the light emitting element and arranging each singulated light emitting element on an adhesive sheet; and forming the reflective layer to cover the side surface of the light emitting element and the side surface of the fluorescent material layer (refer to, for example, FIGS. 11 and 12).

SUMMARY

According to one aspect of the present invention, in a method for manufacturing a light emitting device, a light emitting element is provided. The light emitting element has a light emitting surface, a bottom surface, and a light emitting element outer peripheral side surface. From the light emitting surface, the light emitting element is configured to emit light in a light emitting direction. The bottom surface is opposite to the light emitting surface in the light emitting direction. The light emitting element outer peripheral side surface is provided between the light emitting surface and the bottom surface. A soluble member is provided on the light emitting surface of the light emitting element. The soluble member is soluble in a solvent. The soluble member has a first surface facing the light emitting surface, a second surface opposite to the first surface in the light emitting direction, and a soluble member outer peripheral side surface provided between the first surface and the second surface. A light-blocking member made of a material which is not soluble in the solvent is provided to cover the light emitting element outer peripheral side surface and the soluble member outer peripheral side surface so that an inner side wall of the light-blocking member contacts the soluble member outer peripheral side surface. The soluble member is removed using the solvent to provide a recess surrounded by the inner side wall of the light-blocking member. A first light-transmissive member is provided in the recess.

According to another aspect of the present invention, in a method for manufacturing a light emitting device, a light emitting element is provided. The light emitting element has a light emitting surface, a bottom surface, and a light emitting element outer peripheral side surface. From the light emitting surface, the light emitting element is configured to emit light in a light emitting direction. The bottom surface is opposite to the light emitting surface in the light emitting direction. The light emitting element outer peripheral side surface is provided between the light emitting surface and the bottom surface. A first light-blocking member made of a material which is not soluble in a solvent is provided to cover the light emitting element outer peripheral side surface. A soluble member which is soluble in the solvent is provided on the light emitting surface of the light emitting element. The soluble member has a first surface facing the light emitting surface, a second surface opposite to the first surface in the light emitting direction, and a soluble member outer peripheral side surface provided between the first surface and the second surface. A second light-blocking member made of the material which is not soluble in the solvent is provided on an upper surface of the first light-blocking member to cover the soluble member outer peripheral side surface so that an inner side wall of the second light-blocking member contacts the soluble member outer peripheral side surface. The soluble member is removed using the solvent to provide a recess surrounded by the inner side wall of the second light-blocking member. A first light-transmissive member is provided in the recess.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9I-1 is a schematic cross-sectional view illustrating a soluble member removing step of the method for manufacturing the light emitting device according to the second embodiment;

FIG. 9I is a schematic cross-sectional view illustrating a first light-transmissive member forming step of the method for manufacturing the light emitting device according to the second embodiment.

DESCRIPTION OF THE EMBODIMENTS

Figure 1A:
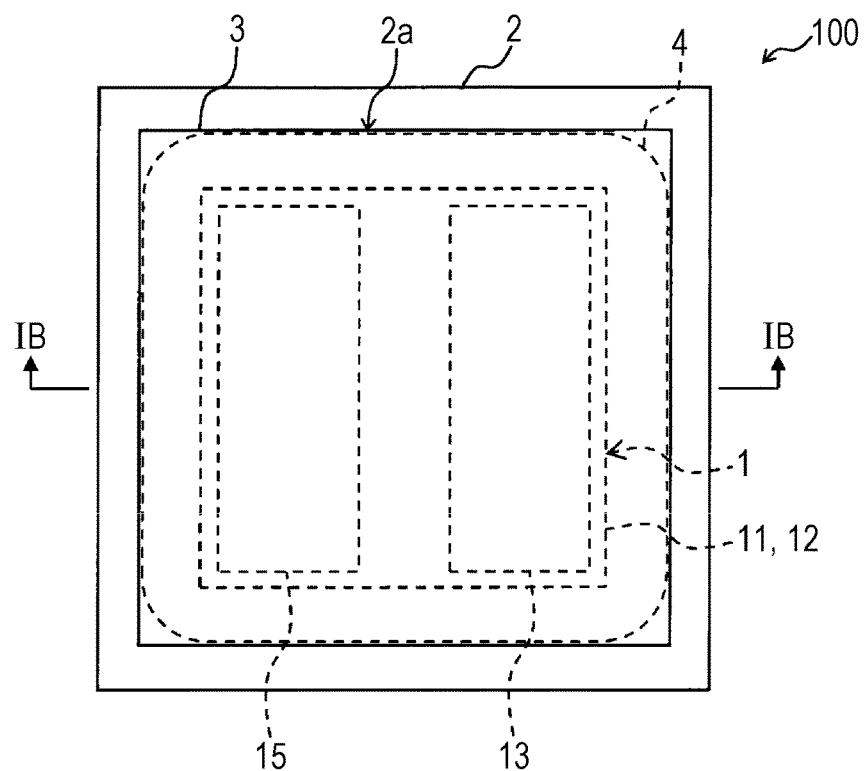
FIG. 1A is a schematic plan view illustrating a configuration of a light emitting device in a first embodiment.

The embodiments will now be described with reference to the accompanying drawings, wherein like reference numerals designate corresponding or identical elements throughout the various drawings.

Description will be given below of light emitting devices according to exemplary embodiments and methods for manufacturing the light emitting devices.

It should be noted that the drawings for reference in the following description schematically illustrate the exemplary embodiments. In the respective drawings, therefore, dimensions of members, a distance between the members, and a positional relationship among the members are exaggerated or some of the members are not illustrated in some cases. With regard to the dimensions of the members and the distance between the members, a plan view is different from a cross-sectional view in some cases. In the following description, identical designations and reference signs indicate identical or equivalent members in principle, and therefore the detailed description of the identical or equivalent members will not be given as appropriate. Configurations described in an embodiment and a modification of this embodiment may be mutually applied to another embodiment and a modification of this embodiment.

First Embodiment

Configuration of Light Emitting Device

Figure 1B:
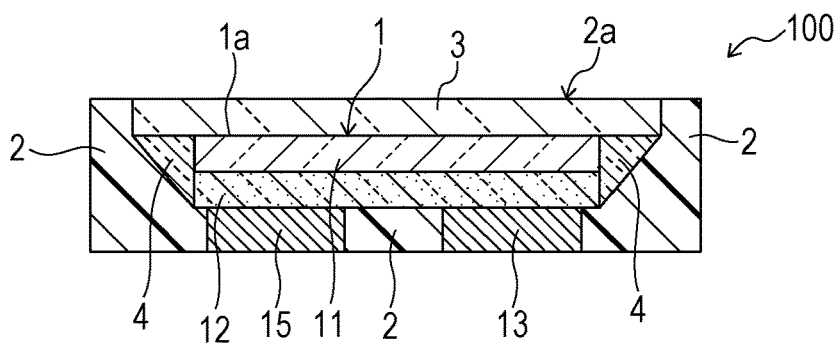
FIG. 1B is a schematic cross-sectional view taken along line IB-IB in FIG. 1A, which illustrates the configuration of the light emitting device according to the first embodiment.

With reference to FIGS. 1A and 1B, description will be given of a configuration of a light emitting device according to a first embodiment.

A light emitting device 100 according to this embodiment has a cuboidal outer shape which is a roughly square in planar view. The light emitting device 100 includes a semiconductor light emitting element 1 (hereinafter, referred to as a "light emitting element" as appropriate) having a roughly square shape in planar view, a second light-transmissive member 4 disposed around side surfaces of the light emitting element 1, a first light-transmissive member 3 disposed on an upper surface of the light emitting element 1 and an upper surface of the second light-transmissive member 4, and a light-blocking member 2 disposed to cover a bottom surface of the light emitting element 1, a side surface of the second light-transmissive member 4, and a side surface of the first light-transmissive member 3.

The light emitting device 100 has an upper surface serving as a light extraction surface, and light emitted from the light emitting element 1 is extracted from the light extraction surface to the outside through the first light-transmissive member 3. The light emitting device 100 also has a lower surface serving as a mounting surface. That is, an n-side electrode 13 and a p-side electrode 15 of the light emitting element 1 are exposed as connection terminals on the lower surface.

Next, specific description will be given of configurations of the respective components in the light emitting device 100 in sequence.

The light emitting element 1 of this embodiment is preferably a semiconductor light emitting element such as an LED. The light emitting element 1 of this embodiment has a roughly cuboidal outer shape which is a roughly square in planar view. The light emitting element 1 has the n-side electrode 13 and the p-side electrode 15 on one surface thereof, which is suitably configured for flip-chip mounting.

Figure 2:
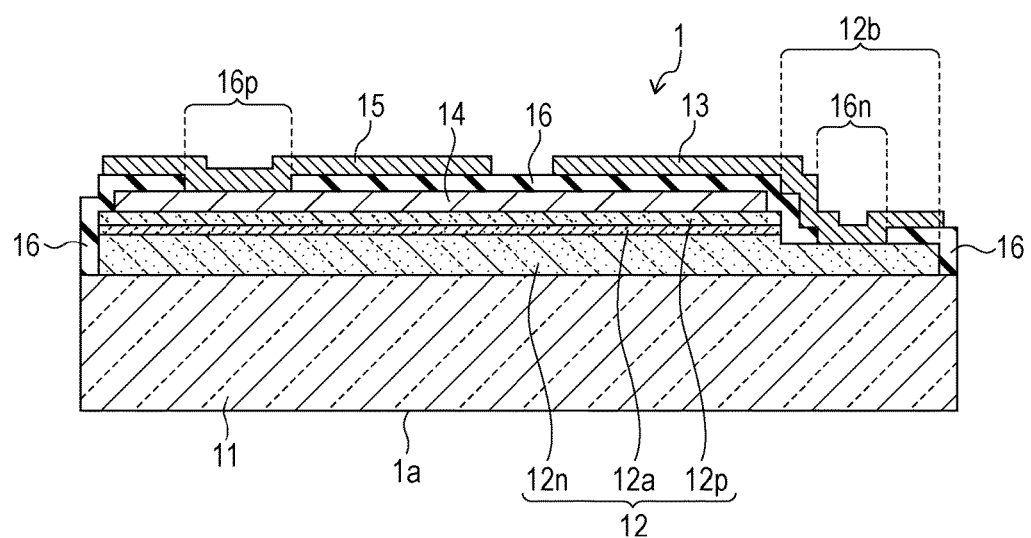
FIG. 2 is a schematic cross-sectional view illustrating an exemplary configuration of a semiconductor light emitting element in the light emitting device according to the first embodiment.

With reference to FIG. 2, description will be given of an exemplary configuration of the light emitting element 1. FIG. 2 illustrates the light emitting element 1 with the surface having the n-side electrode 13 and the p-side electrode 15 directed upward, which is opposite in orientation to FIG. 1B. FIGS. 1A and 1B as well as FIGS. 4B to 7B and FIG. 9A to 9J (which will be described later) each illustrate the configuration of the light emitting element 1 in a simplified manner.

The light emitting element 1 includes a substrate 11, a semiconductor laminated body 12, the n-side electrode 13, an overall electrode 14, the p-side electrode 15, and an insulating film 16.

The semiconductor laminated body 12 of the light emitting element 1 has an LED structure in which an n-type semiconductor layer 12n, an active layer 12a, and a p-type semiconductor layer 12p are laminated on one main surface of the substrate 11. The semiconductor laminated body 12 emits light when the n-side electrode 13 and the p-side electrode 15 are energized by an external power supply connected thereto.

The substrate 11 is a member to support the semiconductor laminated body 12. Specific examples of a material for the substrate 11 may include sapphire and SiC. The substrate 11 may alternatively be a growth substrate on which the semiconductor laminated body 12 is epitaxially grown. For example, sapphire is preferably usable in a case where the semiconductor laminated body 12 is formed using a nitride semiconductor such as GaN (gallium nitride).

The substrate 11 may be removed by, for example, a laser lift-off (LLO) method after the formation of the semiconductor laminated body 12 on the substrate 11, so that an opposite surface to an electrode-forming surface of the semiconductor laminated body 12 is formed as a light extraction surface. In this case, the substrate 11 is preferably removed after a resin support layer is formed on the electrode-forming surface to enhance the mechanical strength of the light emitting element 1.

As illustrated in FIG. 2, the semiconductor laminated body 12 has the n-type semiconductor layer 12n, active layer 12a, and p-type semiconductor layer 12p laminated on the one main surface corresponding to an upper surface of the substrate 11.

The semiconductor laminated body 12 has an exposed portion 12b which is a region where the p-type semiconductor layer 12p and the active layer 12a are not partially provided, that is, a region where the n-type semiconductor layer 12n is exposed on an upper surface of the semiconductor laminated body 12. In the exposed portion 12b, the n-side electrode 13 is electrically connected to the n-type semiconductor layer 12n. In should be noted that the exposed portion 12b is referred to as the "exposed portion" for the sake of convenience although it is covered with the n-side electrode 13 and the insulating film 16.

The overall electrode 14 with electrically-conductive and light-reflective properties is disposed on almost an entire upper surface of the p-type semiconductor layer 12p. The surface of the semiconductor laminated body 12 is covered with the insulating film 16 directly or with the overall electrode 14 interposed between the semiconductor laminated body 12 and the insulating film 16, except for a part of an upper surface of the exposed portion 12b and a part of an upper surface of the overall electrode 14.

The semiconductor laminated body 12 (the n-type semiconductor layer 12n, the active layer 12a, and the p-type semiconductor layer 12p) is favorably made of a nitride semiconductor expressed by $In_XAl_YGa_{1-X-Y}N$ ($0 \leq X$, $0 \leq Y$, $X+Y \leq 1$). Each of these semiconductor layers may have a single-layer structure or a laminated-layer structure having layers different in composition and thickness from one another, or may partially have a super lattice structure. Especially, the active layer 12a preferably has a single quantum well structure or multiple quantum well structure in which thin films having quantum effects are laminated.

The overall electrode 14 is disposed to cover almost the entire upper surface of the p-type semiconductor layer 12p. The overall electrode 14 functions as a conductor layer that diffuses a current supplied through the p-side electrode 15 on a part of the upper surface thereof, to an entire surface of the p-type semiconductor layer 12p. In addition, the overall electrode 14 has light-reflective property, and also functions as a reflective film that reflects the light from the light emitting element 1 downward (upward in FIG. 1B) to the light extraction surface.

The overall electrode 14 may be made of a metal material with good electrically-conductive and light-reflective properties. Especially, a metal material with a good light-reflective property in a visible light region preferably includes Ag, Al, and an alloy containing these metals as a main component. Furthermore, the overall electrode 14 may be formed of a single layer or laminated layers of the above metal material. Especially, in a case where a lower layer (on the p-type semiconductor layer 12p) of the overall electrode 14 is made of Ag which is likely to migrate, an upper layer, which covers the lower layer, is preferably made of a metal material with favorable electrically-conductive and barrier properties, such as Al, Ti, W, or Au.

The n-side electrode 13 is electrically connected to the n-type semiconductor layer 12n in an opening 16n of the insulating film 16, on the upper surface of the exposed portion 12b of the semiconductor laminated body 12. The p-side electrode 15 is electrically connected to the overall electrode 14 in an opening 16p of the insulating film 16, on the upper surface of the overall electrode 14.

The n-side electrode 13 and the p-side electrode 15 extend largely over the overall electrode 14 with the insulating film 16 interposed between each of the n-side electrode 13 and the p-side electrode 15 and the overall electrode 14.

Each of the n-side electrode 13 and the p-side electrode 15 may be made of a metal material including a single metal such as Ag, Al, Ni, Rh, Au, Cu, Ti, Pt, Pd, Mo, Cr, or W, or an alloy containing the above metal as a main component. Each of the n-side electrode 13 and the p-side electrode 15 may be formed of a single layer or laminated layers made of the above metal material.

The insulating film 16 covers the upper surfaces and side surfaces of the semiconductor laminated body 12 and overall electrode 14. The insulating film 16 has the opening 16n formed in a part of a bottom surface of the exposed portion 12b, and has the opening 16p formed in a part of the upper surface of the overall electrode 14. Furthermore, the n-side electrode 13 and the p-side electrode 15 extend largely over the upper surface of the insulating film 16 in a complementary manner. The insulating film 16 is made of an oxide such as $SiO_2$, $TiO_2$, or $Al_2O_3$, a nitride such as $Si_3N_4$, or a fluoride such as $MgF_2$.

The light emitting element 1 is preferably a chip size package (CSP) or chip scale package (CSP) type light emitting element in which a support layer made of, for example, a resin is disposed on the electrode-forming surface, and an external connection metal terminal such as a metal bump or a post electrode is further formed on the n-side electrode 13 and the p-side electrode 15. Thus, the light emitting device can be reduced in size. In addition, the light emitting element 1 may not have the substrate 11 as described above.

Referring to FIGS. 1A and 1B again, the description of the configuration of the light emitting device 100 will be continued.

The light-blocking member 2 is disposed around the side surfaces of the light emitting element 1 with the second light-transmissive member 4 interposed between the light-blocking member 2 and the light emitting element 1, and the upper surface thereof is higher in height than the light extraction surface 1a which is the upper surface of the light emitting element 1. Therefore, a recess portion 2a having a roughly regular cuboidal shape is formed, which has a side wall defined by an upper portion of the light-blocking member 2, and a bottom surface defined by the upper surface of the light emitting element 1 and an upper surface of the second light-transmissive member 4. This recess portion 2a is filled with the first light-transmissive member 3. In other words, the light-blocking member 2 covers the side surface of the second light-transmissive member 4 and the side surface of the first light-transmissive member 3.

The light-blocking member 2 is a member that blocks light, and may be made of a light-reflective material that blocks the light by reflecting the light, or a light-absorbing material that blocks the light by absorbing the light.

In the case where the light-blocking member 2 is made of the light-reflective material, the light-blocking member 2 functions to reflect the light emitted from the side surface of the light emitting element 1 and passed through the second light-transmissive member 4, upward, that is, in a light extracting direction, and to reflect the light emitted from the side surface of the first light-transmissive member 3 back to the first light-transmissive member 3. Thus, the light emission brightness of the upper surface of the light emitting device 100 can be improved.

In the case where the light-blocking member 2 is made of the light-absorbing material, the light-blocking member 2 functions to absorb the light emitted from the side surface of the light emitting element 1 into the light-blocking member 2 after passed through the second light-transmissive member 4. Therefore, the light can be emitted mainly from the upper surface of the light emitting device 100.

When the light-blocking member 2 is provided irrespective of whether the light-blocking member 2 is made of the light-reflective material or the light-absorbing material, main part of the light from the light emitting device 100 can be emitted from the upper surface of the first light-transmissive member 3, so that the light emitting device 100 can be high in contrast between a light emission region and a light non-emission region, that is, its visibility can be improved.

When the light emitting device with good visibility is used in a backlight device or an illumination device, the following merits may be provided.

In a case where the light emitting device is used in a backlight device in which a light guide plate has a light incident lateral surface, the light emitting device 100 can be increased in front surface brightness, so that light incident efficiency from the lateral surface of the light guide plate can be enhanced, whereby it is possible to enhance the efficiency of the light used as backlight illumination light.

In a case where the light emitting device is used in a direct type backlight device in which a light guide plate having a light incident lateral surface is not provided, the light emitting device 100 can be reduced in light emission area, so that light distribution control can be easily performed with a secondary lens. Thus, it is possible to reduce brightness unevenness and color unevenness in the backlight illumination light.

In a case where the light emitting device is used in a standard illumination device, the light emitting device 100 can be reduced in light emission area, so that the light distribution control can be easily performed with a lens. Thus, when the plurality of light emitting devices 100 are mounted at a narrow pitch, the light emitted from the light emitting device 100 can be prevented from being applied to and absorbed or blocked by the adjacent light emitting device 100. That is, the light emitted from the light emitting device 100 can be hardly affected by the adjacent light emitting device 100. As a result, light use efficiency of the light emitting device is hardly affected by a light reflectivity of materials composing the light emitting device 100 such as a base material of the light blocking member 2 constituting the outline of the light emitting device 100, so that a material of the base material can be selected from a variety of options.

The light emitting device according to this embodiment may not have the second light-transmissive member 4. In this case, the light-blocking member 2 is disposed in contact with the side surface of the light emitting element 1. Here, when the light-blocking member 2 is made of the light-reflective material, the light reflected at an interface between the light emitting element 1 and the light-blocking member 2 can be returned into the light emitting element 1, travel in the light emitting element 1, and be extracted from the light extraction surface 1a to the outside. In addition, when the light-blocking member 2 is made of the light-absorbing material, the light reaching the interface between the light emitting element 1 and the light-blocking member 2 can be partially reflected at the interface, but be mainly absorbed by the light-blocking member 2 and is not extracted to the outside.

The light-reflective material includes a light-reflective property-added resin material obtained by mixing a resin having high light-transmissive and insulating properties, with particles of a light-reflective substance. The resin may include an epoxy resin and a silicone resin. Furthermore, the light-reflective substance may include $TiO_2$, $Al_2O_3$, $ZrO_2$, and MgO.

Furthermore, the light-absorbing material includes a light-absorbing property-added resin material obtained by mixing the same resin material as in the above light-reflective material, with particles of a light-absorbing substance. The light-absorbing substance includes black pigment and favorably includes carbon-based pigment such as carbon black or graphite.

The light-blocking member 2 is made of the resin material containing the light-reflective substance to have the light-reflective property, or the resin material containing the light-absorbing substance to have the light-absorbing property, by a die molding method such as transfer molding, injection molding, or compression molding, or by a coating method such as screen printing.

When the light-reflective material is used for the light-blocking member 2, the light from the light emitting element 1 can be efficiently extracted to the outside. Furthermore, when the light-absorbing material is used for the light-blocking member 2, resin moldability can be enhanced, so that the reliability of the light emitting device 100 can be improved.

The first light-transmissive member 3 is disposed in the recess portion 2a to continuously cover the upper surface serving as the light extraction surface 1a of the light emitting element 1 and the upper surface of the second light-transmissive member 4. Furthermore, the side surface of the first light-transmissive member 3 is covered with the light-blocking member 2.

The first light-transmissive member 3 may be a wavelength conversion member made of a light-transmissive resin containing a wavelength conversion substance that converts the light from the light emitting element 1 to the light having a different wavelength. The first light-transmissive member 3 may alternatively be a light-diffusing member made of a light-transmissive resin containing a light-diffusing substance that diffuses the light emitted from the upper surfaces of the light emitting element 1 and the second light-transmissive member 4. The first light-transmissive member 3 may alternatively be made of a light-transmissive resin to protect the light emitting element 1.

The wavelength conversion substance may be any fluorescent material. Examples of the fluorescent material may include a cerium-activated yttrium aluminum garnet (YAG)-based fluorescent material that emits green to yellow light, a cerium-activated lutetium aluminum garnet (LAG)-based fluorescent material that emits green light, a europium- and/or chromium-activated nitrogen-containing calcium aluminosilicate ($CaO$—$Al_2O_3$—$SiO_2$)-based fluorescent material that emits green to red light, a europium-activated silicate (($Sr, Ba)_2SiO_4$)-based fluorescent material that emits blue to red light, a nitride-based fluorescent material such as a β sialon fluorescent material that emits green light or a CASN-based or SCASN-based fluorescent material that emits red light, a KSF ($K_2SiF_6$: Mn)-based fluorescent material that emits red light, and a sulfide-based fluorescent material that emits green or red light.

The light-diffusing substance may be the same material as the above light-reflective substance.

The first light-transmissive member 3 may be made of a light-transmissive resin containing a mixture of a plurality of kinds of wavelength conversion substances and light-diffusing substances.

The first light-transmissive member 3 may be formed by filling the recess portion 2a with the resin material containing particles of the above-described wavelength conversion substance and/or light-diffusing substance for adding various kinds of functions. The resin material may not contain the above particles.

The first light-transmissive member 3 is formed by a coating method such as spraying, screen printing, or potting (dropping), or a die molding method such as injection molding, transfer molding, or compression molding.

The wavelength conversion substance serving as a functional substance includes a fragile material such as a KSF fluorescent material. When particles of the fragile fluorescent material are used, the fluorescent material particles might be damaged by the method such as spraying by which an impact is applied to the fluorescent material particles at the time of coating, or the method such as screen printing by which a pressure is applied to the fluorescent material particles.

Therefore, when the first light-transmissive member 3 is made of the resin material containing the fragile particles, the potting is preferably used. In the potting method, when slung containing the fluorescent material particles is applied, a high impact or pressure may not be applied to the particles of the fluorescent material, so that damage of the fluorescent material particles can be reduced.

According to this embodiment, the first light-transmissive member 3 is disposed in the recess portion 2a defined by the light-blocking member 2. Therefore, even when the slurry or liquid resin is applied by the potting method, the first light-transmissive member 3 can be placed in a high precision position and can be foil led into a high precision shape.

The second light-transmissive member 4 is disposed in contact with at least the side surface of the light emitting element 1 to surround an outer periphery of the light emitting element 1 in planar view. The second light-transmissive member 4 functions as a light guide member to guide the light emitted from the side surface of the light emitting element 1 upward, that is, in the light extracting direction.

The second light-transmissive member 4 may be disposed on a part of the side surface of the light emitting element 1 rather than the entire side surface of the light emitting element 1, in planar view. The second light-transmissive member 4 may not be disposed on the entire side surface of the light emitting element 1 in a thickness direction, but may be partially disposed on a region including at least a vicinity of the light extraction surface 1a. With this configuration, the light extraction surface 1a of the upper surface of the light emitting element 1 can be expanded by the second light-transmissive member 4, so that the efficiency to extract light from the light emitting device 100 can be improved.

As for a shape of the second light-transmissive member 4, according to this embodiment, the second light-transmissive member 4 preferably has an outer surface inclined so that the shape in planar view is increased as it goes upward, that is, toward the light extraction surface in the thickness direction of the light emitting element 1. The outer surface of the second light-transmissive member 4 may be a substantially flat surface in which its cross-sectional shape is composed of a straight line according to this embodiment, or may be a curved surface bowed downward or bowed upward. When the second light-transmissive member 4 has the above shape, the light emitted from the side surface of the light emitting element 1 can be reflected upward by the outer surface of the second light-transmissive member 4, so that the light can be efficiently extracted to the outside.

The outer surface of the second light-transmissive member 4 is covered with the light-blocking member 2, and the upper surface of the second light-transmissive member 4 is covered with the first light-transmissive member 3 continuously from the upper surface of the light emitting element 1. The light emitted from the upper surface of the second light-transmissive member 4 can be extracted to the outside through the first light-transmissive member 3.

The second light-transmissive member 4 can be made of a material such as a resin or glass having a good light-transmissive property. Furthermore, the second light-transmissive member 4 is preferably made of a material having a refractive index higher than that of the resin material for the light-blocking member 2. When the second light-transmissive member 4 is made of the material having the refractive index higher than that of the resin material for the light-blocking member 2, the light can be efficiently reflected off its outer surface serving as the interface with the light-blocking member 2, based on Snell's law.

In addition, the second light-transmissive member 4 can be formed such that a liquid or paste resin material is supplied onto the side surface of the light emitting element 1 with a dispenser, and then is cured.

Operation of Light Emitting Device

With reference to FIGS. 1A and 1B, next, description will be given of an operation of the light emitting device 100 according to the first embodiment.

In this embodiment, the light emitting element 1 emits blue light, and the first light-transmissive member 3 contains particles of a fluorescent material (wavelength conversion substance) that absorbs the blue light and emits yellow light.

The light emitting element 1 in the light emitting device 100 emits the blue light when a current is supplied between the n-side electrode 13 and the p-side electrode 15 from the external power supply.

The blue light emitted from the light emitting element 1 partially travels in the semiconductor laminated body 12 and the substrate 11 of the light emitting element 1 and enters the first light-transmissive member 3 from the upper surface, that is, the light extraction surface 1a of the light emitting element 1. In addition, the light traveling in the light emitting element 1 in the horizontal direction partially enters the second light-transmissive member 4 and is reflected by the light-blocking member 2. Then, the reflected light enters the first light-transmissive member 3 through the upper surface, that is, the expanded light extraction surface of the second light-transmissive member 4. The second light-transmissive member 4 can improve the efficiency of extracting light from the light emitting element 1. Furthermore, the light traveling in the light emitting element 1 in the lower direction may be reflected by the overall electrode 14 upward and enters the first light-transmissive member 3 through the light extraction surface 1a.

In the case where the light-blocking member 2 is made of the light-absorbing material, a part of the light is reflected at the interface between the second light-transmissive member 4 and the light-blocking member 2, but the remaining light is absorbed by the light-blocking member 2.

A part of the incident blue light in the first light-transmissive member 3 is absorbed by the fluorescent material contained in the first light-transmissive member 3, is converted to the yellow light through wavelength conversion, and is extracted from the light emitting device 100 to the outside. At least the remaining part of the incident blue light in the first light-transmissive member 3 is extracted from the light emitting device 100 to the outside as the blue light without being absorbed by the fluorescent material. Thus, white light is extracted from the light emitting device 100 to the outside.

When the first light-transmissive member 3 does not contain the fluorescent material, the light emitted from the light emitting element 1 can be extracted from the light emitting device 100 to the outside without being subjected to the wavelength conversion. Alternatively, when the first light-transmissive member 3 contains the large amount of fluorescent material, all of the light emitted from the light emitting element 1 can be converted to the light having the different wavelength and can be extracted from the light emitting device 100 to the outside.

Method for Manufacturing Light Emitting Device

Figure 3:
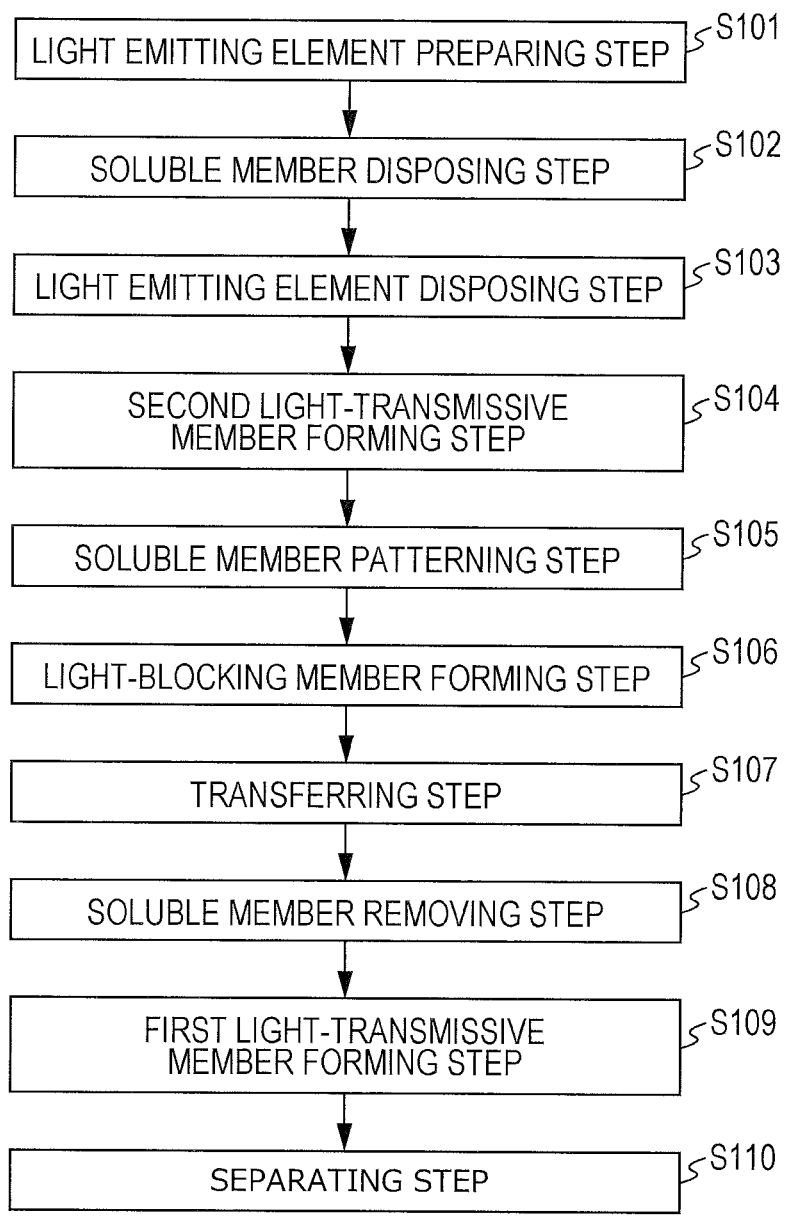
FIG. 3 is a schematic flowchart illustrating a procedure of a method for manufacturing the light emitting device according to the first embodiment.
Figure 4A:
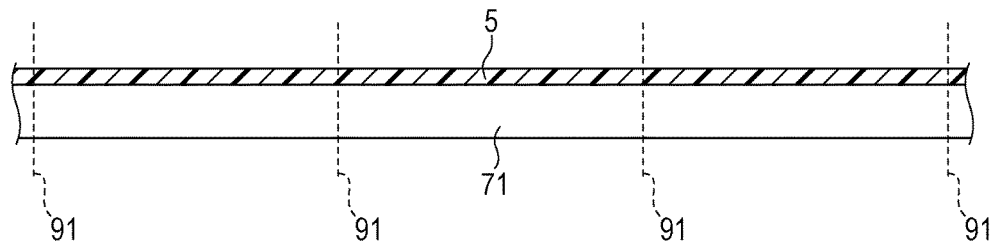
FIG. 4A is a schematic cross-sectional view illustrating a soluble member disposing step of the method for manufacturing the light emitting device according to the first embodiment.
Figure 4B:
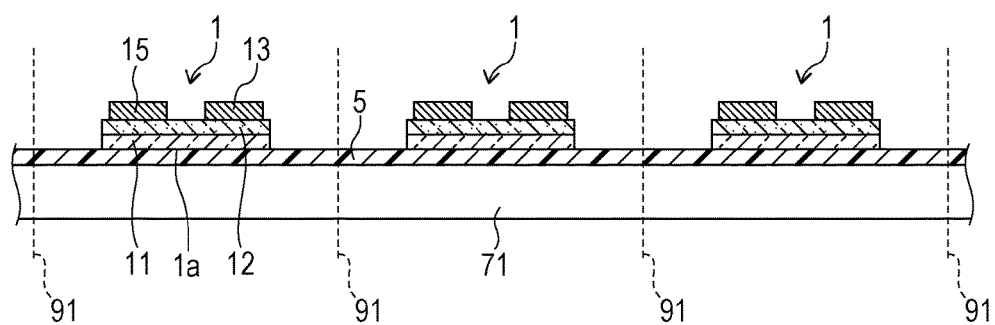
FIG. 4B is a schematic cross-sectional view illustrating a light emitting element disposing step of the method for manufacturing the light emitting device according to the first embodiment.
Figure 4C:
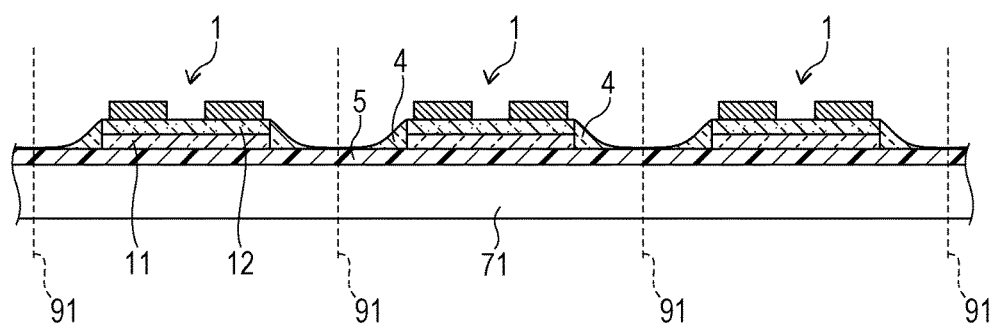
FIG. 4C is a schematic cross-sectional view illustrating a second light-transmissive member forming step of the method for manufacturing the light emitting device according to the first embodiment.
Figure 4D:
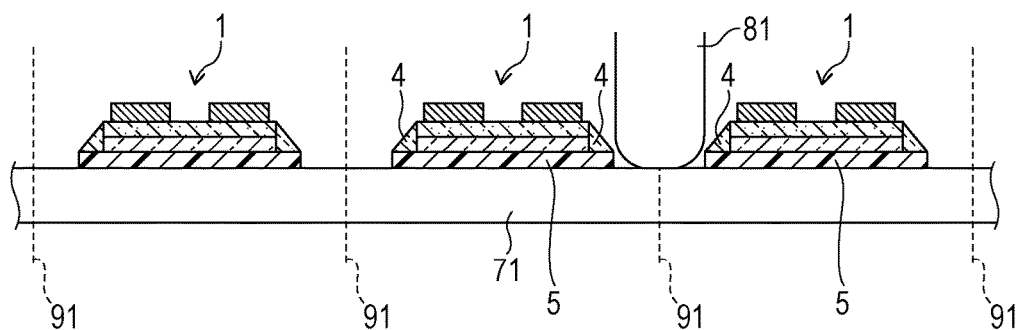
FIG. 4D is a schematic cross-sectional view illustrating a soluble member patterning step of the method for manufacturing the light emitting device according to the first embodiment.
Figure 4E:
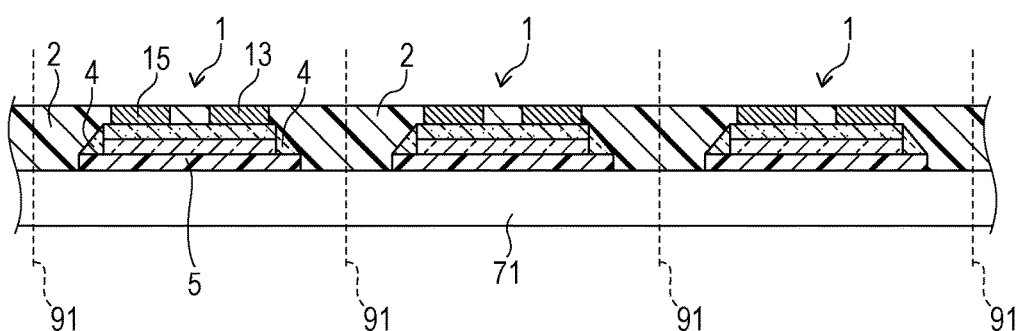
FIG. 4E is a schematic cross-sectional view illustrating a light-blocking member forming step of the method for manufacturing the light emitting device according to the first embodiment.
Figure 4F:
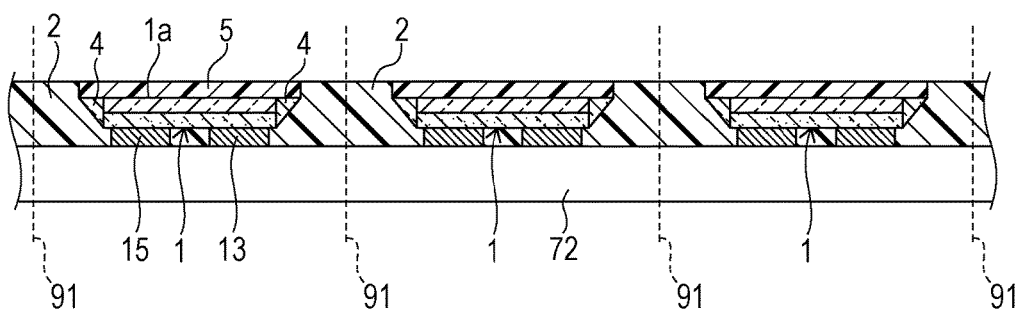
FIG. 4F is a schematic cross-sectional view illustrating a transferring step of the method for manufacturing the light emitting device according to the first embodiment.
Figure 4G:
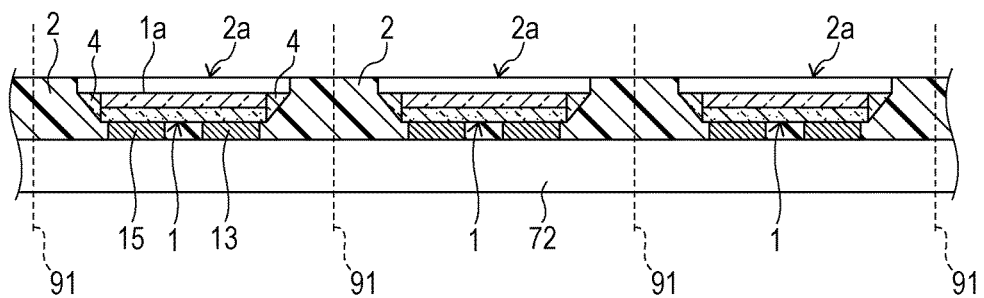
FIG. 4G is a schematic cross-sectional view illustrating a soluble member removing step of the method for manufacturing the light emitting device according to the first embodiment.
Figure 4H:
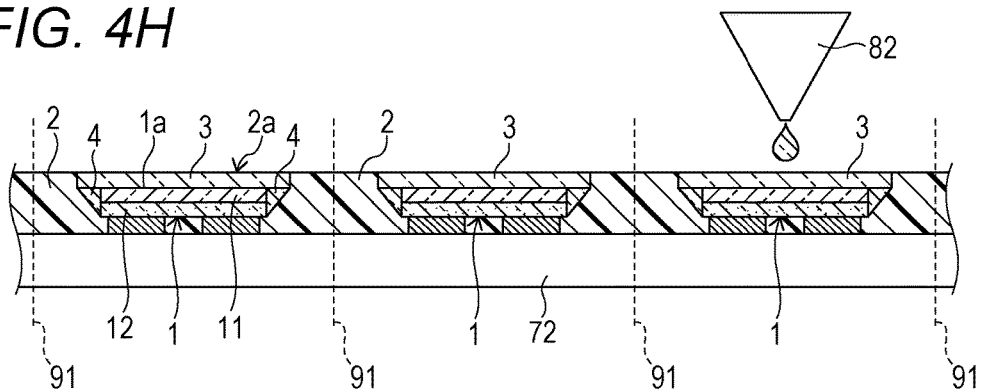
FIG. 4H is a schematic cross-sectional view illustrating a first light-transmissive member forming step of the method for manufacturing the light emitting device according to the first embodiment.
Figure 4I:
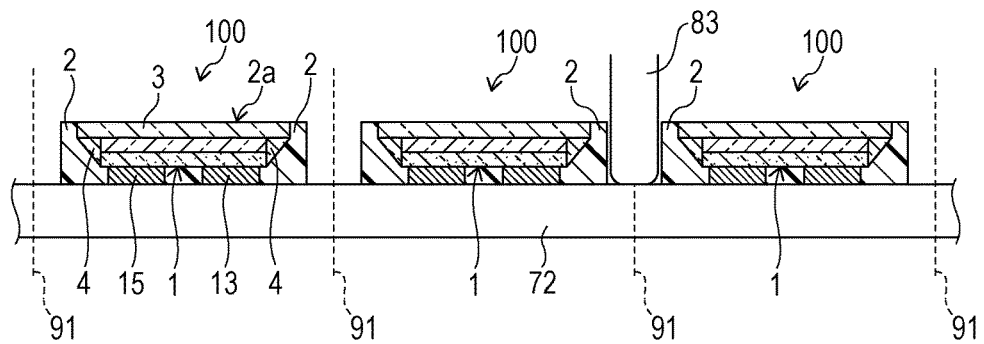
FIG. 4I is a schematic cross-sectional view illustrating a singulating step of the method for manufacturing the light emitting device according to the first embodiment.

With reference to FIGS. 3 to 4I, next, description will be given of the method for manufacturing the light emitting device 100 according to the first embodiment.

The method for manufacturing the light emitting device 100 includes a light emitting element preparing step S101, a soluble member disposing step S102, a light emitting element disposing step S103, a second light-transmissive member forming step S104, a soluble member patterning step S105, a light-blocking member forming step S106, a transferring step S107, a soluble member removing step S108, a first light-transmissive member forming step S109, and a separating step S110.

First, in the light emitting element preparing step S101, the separated light emitting element 1 having the configuration illustrated in FIG. 2 is prepared. Hereinafter, the step of manufacturing the light emitting element 1 will be described below as one example, but the commercially available light emitting element 1 may be prepared in the light emitting element preparing step S101.

More specifically, first, the semiconductor laminated body 12 is formed on the substrate 11 made of sapphire, by sequentially laminating the n-side electrode 12n, the active layer 12a, and the p-side electrode 12p with the above-described semiconductor material. After that, the p-side electrode 12p and the active layer 12a are entirely and the n-type semiconductor layer 12n is partially etched away in the one region of the upper surface of the semiconductor laminated body 12 to form the exposed portion 12b in which the n-side electrode 12n is exposed on the upper surface.

Next, the light-reflective overall electrode 14 is formed to cover almost the entire upper surface of the p-side electrode 12p.

Next, the insulating film 16 is formed of a material such as $SiO_2$ on a surface of a wafer except for the openings 16n and 16p serving as a connection region between the n-side electrode 13 and the n-type semiconductor layer 12n and a connection region between the p-side electrode 15 and the overall electrode 14, respectively.

Next, the n-side electrode 13 serving as the pad electrode is formed to extend from the opening 16n to the upper surface of the insulating film 16. In addition, the p-side electrode 15 serving as the pad electrode is formed to extend from the opening 16p to the upper surface of the insulating film 16.

Thus, the light emitting element 1 is formed on the wafer. After that, a predetermined cut region of the wafer is cut by a dicing method or scribing method, whereby the separated light emitting elements 1 are manufactured.

Furthermore, before the wafer is cut, the back surface of the substrate 11 may be thinned by grinding, or the substrate 11 may be removed, or the above-described metal bump or post electrode may be formed.

Subsequently, in the soluble member disposing step S102, as illustrated in FIG. 4A, the soluble member 5 is disposed on a sheet-like or plate-like support member 71. The soluble member 5 is formed into a film with a soluble material which is dissolved in a solvent.

The support member 71 is made of a resin, a metal, or ceramic. In a case where the support member 71 is used in the soluble member removing step S108 which will be performed later, the support member 71 is made of a material which is not dissolved in the solvent for dissolving the soluble member 5. The support member 71 preferably has flexibility so that it can be easily peeled off in the transferring step S107 which will be performed later.

The soluble material is dissolved in the solvent. Although detailed description will be given later, the light-blocking member 2 is preferably made of an epoxy resin or a silicone resin. The solvent does not dissolve the material for the light-blocking member 2.

Examples of the solvent include ketone-based organic solvents such as acetone and methyl ethyl ketone, and water-based solvents such as water, warm water, and an alkaline aqueous solution.

The soluble material which is dissolved in the ketone-based solvent includes (A) an acrylic resin having a functional group which reacts with an epoxy resin at 40° C. to 80° C. of glass-transition point (Tg), (B) an epoxy resin, (C) a phenol resin, and (D) a resin film composed of tetraphenylphosphonium tetra (p-tolyl) borate.

Here, the acrylic resin (A) has a hydroxyl group as the functional group which reacts with an epoxy resin. The epoxy resin (B) is at least one selected from the group consisting of a bisphenol A type epoxy resin, a bisphenol F type epoxy resin, a novolak type epoxy resin, a biphenyl type epoxy resin, and an aliphatic type epoxy resin. The epoxy resin (B) is contained by 5 to 50 parts by mass with respect to 100 parts by mass of the acrylic resin (A). The phenol resin (C) is at least one selected from the group consisting of a terpene phenol resin, a bisphenol A type phenol resin, a bisphenol F type phenol resin, and a novolak type phenol resin. The phenol resin (C) is contained by 10 to 35 parts by mass with respect to 100 parts by mass of the acrylic resin (A).

In addition, the soluble material has been disclosed in detail in Japanese Patent No. 4944269, so that the detailed description will not be given here.

Examples of the soluble material dissolved in the water or warm water may include polyvinyl alcohol, water-soluble polyester, and starch.

In addition, the soluble material which is dissolved in the alkaline aqueous solution may be a novolak resin-based or polyhydroxystyrene-based positive type photoresist material for use in manufacturing of a semiconductor.

The soluble member 5 may be provided such that a film made of the above soluble material is attached on the upper surface of the support member 71 by a laminating machine or with a light-transmissive resin as a bonding agent, or the soluble material which is soluble or dissolve in a solvent may be applied on the upper surface of the support member 71.

In addition, the soluble member 5 is formed to have a thickness substantially corresponding to the thickness of the first light-transmissive member 3. Therefore, the thickness of the soluble member 5 is determined according to a function required for the first light-transmissive member 3, and it may be about several to several hundreds of micrometers.

In this embodiment, the plurality of light emitting devices 100 are manufactured collectively, but the light emitting device 100 may be individually manufactured. In FIGS. 4A to 4I, a border line 91 is represented with a broken line as a virtual line to partition the region of the individual light emitting device 100. This is the same in FIGS. 5A and 5B, and FIGS. 9A to 9J which will be described later.

Subsequently, in the light emitting element disposing step (the step of forming the soluble member) S103, as illustrated in FIG. 4B, the light emitting element 1 is disposed on the film-like soluble member 5, with the electrode-forming surface having the n-side electrode 13 and the p-side electrode 15 directed upward. At this time, the light emitting element 1 is disposed with the light extraction surface 1a adhered to the soluble member 5. In other words, as illustrated in FIG. 1A, when the light emitting element 1 is disposed with the light extraction surface 1a directed upward, the soluble member 5 is provided on the upper surface (lower surface in FIG. 4B) of the light emitting element 1.

The light emitting element 1 may be disposed to be bonded to the soluble member 5 with the light-transmissive resin serving as the bonding agent by a die bonder.

In addition, according to this embodiment, since the plurality of light emitting devices 100 are collectively manufactured, the plurality of light emitting elements 1 are disposed and spaced from each other at predetermined intervals, with their side surfaces exposed.

Subsequently, in the second light-transmissive member forming step (the step of forming the second light-transmissive member) S104, as illustrated in FIG. 4C, a light-transmissive resin material is supplied on the side surface of the light emitting element 1 with a dispenser, and then the resin material is cured, whereby the second light-transmissive member 4 serving as a resin fillet is formed.

The second light-transmissive member 4 preferably has the inclined outer surface which spreads toward the light extraction surface 1a (downward in FIG. 4C) in planar view. This shape can be formed such that the resin material having appropriate viscosity is applied to a corner portion formed between the side surface of the substrate 11 of the light emitting element 1 and the upper surface of the soluble member 5, and after the resin has been supplied on the side surface of the substrate 11 of the light emitting element 1 and the upper surface of the soluble member 5 and spread downward due to surface tension and gravity working thereon, the resin is cured.

According to this embodiment, after the light emitting element 1 has been disposed on the flat soluble member 5 with the surface having the electrodes directed upward, the second light-transmissive member 4 is formed in contact with the soluble member 5, so that the light extraction surface 1a (the lower surface in FIG. 4C) of the light emitting element 1, and the light extraction surface (the lower surface in FIG. 4C) expanded by the second light-transmissive member 4 are continuously provided at substantially the same level.

In addition, the outer surface of the second light-transmissive member 4 may be a surface perpendicular to the light extraction surface 1a. In addition, the second light-transmissive member 4 is preferably provided to cover almost an entire region of the side surfaces of the light-transmissive substrate 11 and semiconductor laminated body 12 in the light emitting element 1, but may cover a part of the region.

The shape of the outer surface of the second light-transmissive member 4 may be molded with a die. Alternatively, the second light-transmissive member 4 may be formed such that a frame is provided with a masking tape around an outer periphery of the region for the second light-transmissive member 4, a liquid resin material is filled and cured in a space formed between the frame and the side surface of the light emitting element 1.

Still alternatively, the second light-transmissive member 4 may be formed such that a liquid resin material is supplied onto the side surface of the light emitting element 1 with a spraying device or a dispenser and cured without using the die or the frame.

In addition, the second light-transmissive member 4 is made of the material which is not dissolved in the predetermined solvent for dissolving the soluble member 5 which will be described later.

Subsequently, in the soluble member patterning step S105, as illustrated in FIG. 4D, the soluble member 5 provided in a region having a predetermined width along the border line 91 is removed with a dicer 81, whereby the soluble member 5 is patterned into a predetermined shape. At this time, in a case where the second light-transmissive member 4 reaches the border line 91 or its vicinity, an unnecessary portion of the second light-transmissive member 4 is also removed. In a case where the second light-transmissive member 4 is continuously formed, it is separated with respect to each corresponding light emitting element 1. According to this embodiment, after the plurality of light emitting elements 1 have been disposed on the film-like soluble member 5, the soluble member 5 is separated and patterned into the predetermined shape, so that productivity can be improved.

The soluble member 5 may be patterned based on a size and a layout distance of the light emitting element 1 and a thickness of the light-blocking member 2 which will be described later. The soluble member 5 can be cut with the dicer 81 having a cut width corresponding to the width of the soluble member 5 to be removed.

In a case where the soluble member 5 is made of a photosensitive photoresist material, it may be patterned by a photolithography method.

In the soluble member disposing step S102, the soluble member 5 may be previously formed into the predetermined shape by cutting the film-like soluble material, and then may be disposed on a predetermined position of the support member 71. In this case, the soluble member patterning step S105 can be omitted.

A shape of the soluble member 5 in planar view is appropriately selected depending on a shape of the recess portion of the light emitting device 100 in planar view. For example, examples of the shape may include a rectangular shape, a polygonal shape such as a hexagonal shape, a circular shape, and an elliptical shape. Especially, it is preferable that the shape is slightly larger than and almost the same as the shape of the light emitting element 1 in planar view. In addition, it is preferable that the shape of the soluble member 5 in planar view is slightly larger (for example, 1.01 times to 1.5 times larger) than an outline of the second light-transmissive member 4 provided around the light extraction surface 1a of the light emitting element 1 and almost the same as the outline thereof. Thus, the light emitting device 100 can be reduced in size.

Subsequently, in the light-blocking member forming step (the step of forming the light-blocking member) S106, as illustrated in FIG. 4E, the light-blocking member 2 is formed to cover the side surface of the soluble member 5 and the side surface of the second light-transmissive member 4. The light-blocking member 2 may be made of a light-reflective white resin or a light-absorbing black resin by a method such as transfer molding.

In addition, in a case where the light-blocking member 2 is formed up to a height to cover the upper surfaces of the n-side electrode 13 and p-side electrode 15 of the light emitting element 1, the upper surface of the light-blocking member 2 may be ground to expose the upper surfaces of the n-side electrode 13 and p-side electrode 15.

Subsequently, in the transferring step S107, as illustrated in FIG. 4F, the soluble member 5, the second light-transmissive member 4, the light emitting element 1, and the light-blocking member 2 are transferred from the support member 71 to a support member 72. More specifically, the new support member 72 is attached to the upper surface in FIG. 4E, that is, the electrode-forming surface of the light emitting element 1. After that, the support member 71 is removed, whereby they are transferred to the support member 72. After the transferring step S107, the soluble member 5 is exposed.

Furthermore, the support member 72 may be in the form of a sheet or a plate similar to the support member 71, or the support member 72 may be a mounting substrate to mount the light emitting element 1. In this case, the light emitting element 1 is flip-chip mounted on the support member 72 serving as the mounting substrate.

Subsequently, in the soluble member removing step (the step of forming the recess portion) S108, as illustrated in FIG. 4G, the soluble member 5 is dissolved and removed with the solvent appropriate to its material. Thus, the recess portion 2a is formed in which its bottom surface is defined by the upper surface, that is, the light extraction surface 1a of the light emitting element 1 and the upper surface, that is, the expanded light extraction surface of the second light-transmissive member 4, and its inner surface is defined by the light-blocking member 2.

Subsequently, in the first light-transmissive member forming step (the step of forming the first light-transmissive member) S109, as illustrated in FIG. 4H, the recess portion 2a is filled with a light-transmissive resin material with a dispenser 82, and then the resin material is cured, whereby the first light-transmissive member 3 is formed. The resin material is preferably a thermosetting resin.

In a case where the resin material to be filled is slurry containing solid particles of a fluorescent material, the potting method is preferably used because the slurry can be dropped and filled in the recess portion 2a while the solid particles contained in the slurry are not subjected to high impact and pressure. Therefore, the first light-transmissive member 3 can be formed with high reliability without causing serious damage to the first light-transmissive member 3 containing the fragile solid particles such as KSF. Furthermore, since the region for the first light-transmissive member 3 is surrounded by the recess portion 2a, the first light-transmissive member 3 can be formed with high precision shape even by the potting method.

According to this embodiment, the shape of the recess portion 2a, that is, the shape of the first light-transmissive member 3 can be determined by the shape of the soluble member 5 with high precision. Therefore, the outer shape of the first light-transmissive member 3 can be formed with high precision, compared with a manufacturing method in which the first light-transmissive member 3 is formed first and then the light-blocking member 2 is formed on the side surface of the first light-transmissive member 3. Therefore, the light emitting device 100 having good visibility can be more easily manufactured.

In addition, after the resin material of the first light-transmissive member 3 has been cured, the upper surface of the light emitting device 100 may be ground, so that the upper surface of the first light-transmissive member 3 can be flattened and have a uniform thickness, for example.

As for the slurry to be dropped into the recess portion 2a, the resin containing particles of the fluorescent material having a specific gravity higher than a specific gravity of the resin may be selected. In this case, after the slurry has been dropped, the resin is cured after the particles of the fluorescent material have been precipitated. Thus, the particles of the fluorescent material can be covered with the sufficiently thick resin layer, so that the particles of the fluorescent material can be protected from water or gas in air. Especially, when the KSF fluorescent material or quantum dot fluorescent material is used, the configuration of this embodiment can be preferably applied.

Subsequently, in the separating step S110, the light emitting device 100 is separated with a predetermined width spaced in a cutting process with a dicer 83 along the border line 91. In this separating process of the light emitting device 100, the dicer 83 to be used has a cutting width based on the outer shape and the layout distance of the light emitting device 100.

After that, the light emitting device 100 is removed from the support member 72, whereby the singulated light emitting device 100 is provided.

In addition, in the case where the support member 72 is the mounting substrate to mount the light emitting element 1, the support member 72 is also cut by the dicer 83 to singulate the light emitting device 100 having the mounting substrate.

Modification 1

Figure 5A:
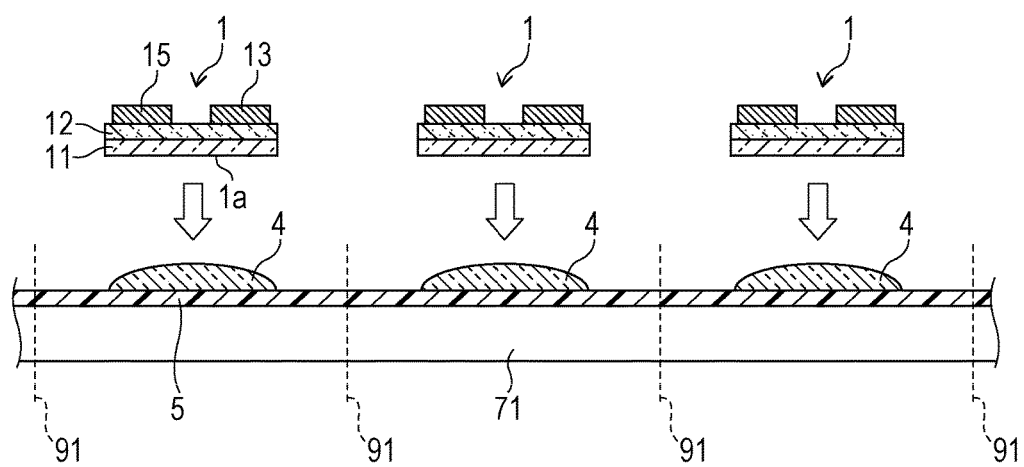
FIG. 5A is a schematic cross-sectional view illustrating a light emitting element disposing step of a method for manufacturing a light emitting device according to a modification of the first embodiment, immediately before a light emitting element is disposed on a support member.
Figure 5B:
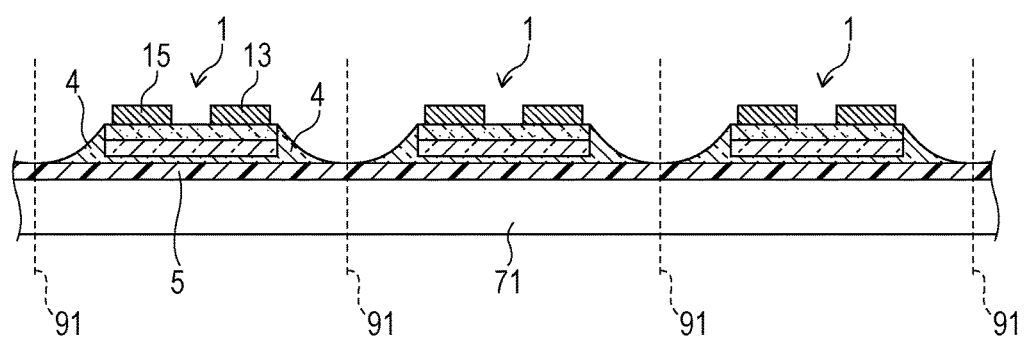
FIG. 5B is a schematic cross-sectional view illustrating the light emitting element disposing step of the method for manufacturing the light emitting device according to the modification of the first embodiment, after the light emitting element has been disposed on the support member.

With reference to FIGS. 5A and 5B, next, description will be given of a modification of the step of forming the second light-transmissive member 4.

In this modification, in the light emitting element disposing step S103, the second light-transmissive member 4 is concurrently formed when the light emitting element 1 is disposed. Therefore, the above second light-transmissive member forming step S104 can be omitted.

First, as illustrated in FIG. 5A, an appropriate amount of light-transmissive resin to make the second light-transmissive member 4 and a bonding agent is applied to the soluble member 5 in which the light emitting element 1 is disposed. Here, the appropriate amount means that the light-transmissive resin does not only bond the light emitting element 1 to the soluble member 5 as the bonding agent but also projects outside the light emitting element 1 in planar view to cover the side surface of the light emitting element 1.

Thus, the light emitting element 1 is disposed and pressed on the liquid light-transmissive resin by a die bonder with the light extraction surface 1a directed downward.

As a result, as illustrated in FIG. 5B, the lower surface of the light emitting element 1 is bonded with the light-transmissive resin, and the excessive light-transmissive resin protrudes outwardly and covers the side surface of the light emitting element 1. Therefore, the second light-transmissive member 4 in this modification integrally covers the lower surface and side surface of the light emitting element 1.

A thickness of the light-transmissive resin on the lower surface of the light emitting element 1 can be adjusted by the pressure applied to the light emitting element 1.

In this modification, other steps are similarly performed according to the procedure illustrated in FIG. 3.

Modification 2

With reference to FIGS. 6A to 6D, next, description will be given of modifications of the step of patterning the soluble member 5. In FIGS. 6A to 6D, the left sides illustrate the soluble members 5 each formed in the soluble member patterning step, and the right sides illustrate light emitting devices 100A to 100D provided with the first light-transmissive members 3 formed by use of the above patterned soluble members 5. Furthermore, in the right sides, the light-blocking members 2 are formed in regions surrounded by broken lines in the light-blocking member forming step.

The side surface of the soluble member 5 may be almost perpendicular to the upper surface of the light emitting element 1, or may be inclined like the modifications illustrated in FIGS. 6A to 6D.

Figure 6A:
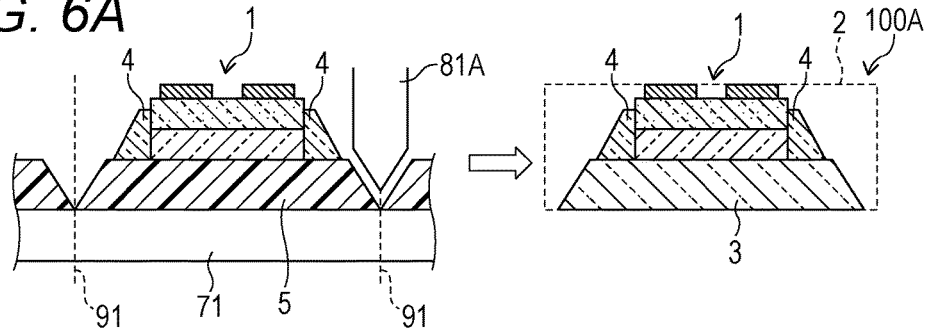
FIGS. 6A to 6D are schematic cross-sectional views each illustrating a light emitting device according to another modification of the first embodiment and a soluble member patterning step of a method for manufacturing the light emitting device.

Especially, as illustrated in FIG. 6A, the side surface of the soluble member 5 is preferably inclined to spread with increasing distance from the light emitting element 1. In this case, the shape of the recess portion 2a formed after the soluble member 5 has been dissolved can be inclined to spread outwardly with increasing distance from the light emitting element 1. Thus, the first light-transmissive member 3 can be formed into the same shape as that of the soluble member 5, so that the light emitting device 100 can be enhanced in light extraction efficiency.

The inclined side surface of the soluble member 5 may be formed by any method. For example, the side surface can be easily formed by cutting the soluble member 5 with a dicer 81A having an inclined cutting blade, instead of the dicer 81.

Figure 6B:
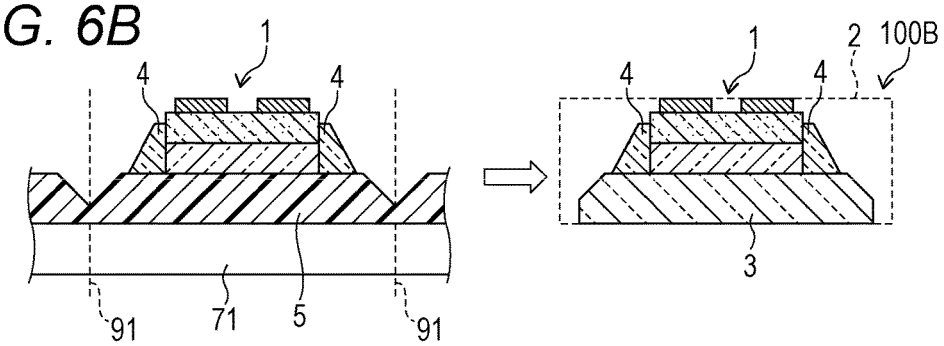

Furthermore, as illustrated in FIG. 6B, the side surface of the soluble member 5 may be partially inclined in a thickness direction. This shape can be formed with the dicer 81A by forming a groove halfway in the thickness direction of the soluble member 5.

Figure 6C:
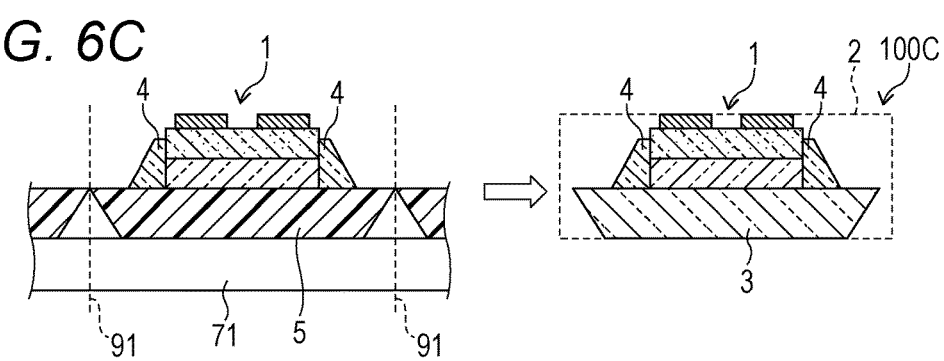

In addition, as illustrated in FIG. 6C, the side surface of the soluble member 5 may be inclined to partially reduce with increasing distance from the light emitting element 1 in the thickness direction. This shape can be formed such that a groove having the same thickness as the thickness of the film-like soluble member 5 is formed with the dicer 81A similar to the example illustrated in FIG. 6A, and turned over, and the soluble member 5 is set on the support member 71.

Figure 6D:
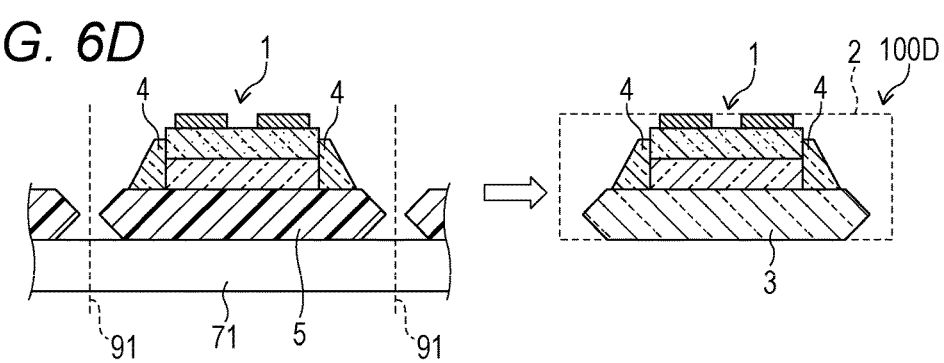

Furthermore, as illustrated in FIG. 6D, the side surface of the soluble member 5 may be inclined so that a middle portion thereof in the thickness direction projects. This shape can be formed as follows. That is, similar to the example in FIG. 6B, the groove having a halfway depth in the thickness direction is formed in the film-like soluble member 5 with the dicer 81A. Then, the soluble member is turned over and is set on the support member 71, and a groove having a halfway depth in the thickness direction is formed from an opposite surface with the dicer 81A.

As illustrated in FIGS. 6A to 6D, with the soluble members 5 having the variously inclined side surfaces, the light emitting devices 100A to 100D can be provided with the first light-transmissive members 3 having the same shapes as those of the soluble members 5.

Second Embodiment

Configuration of Light Emitting Device

Figure 7A:
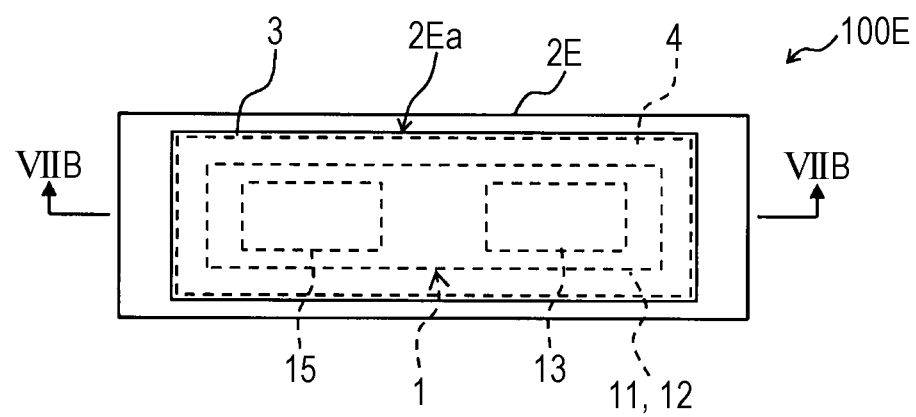
FIG. 7A is a schematic plan view illustrating a configuration of a light emitting device according to a second embodiment.
Figure 7B:
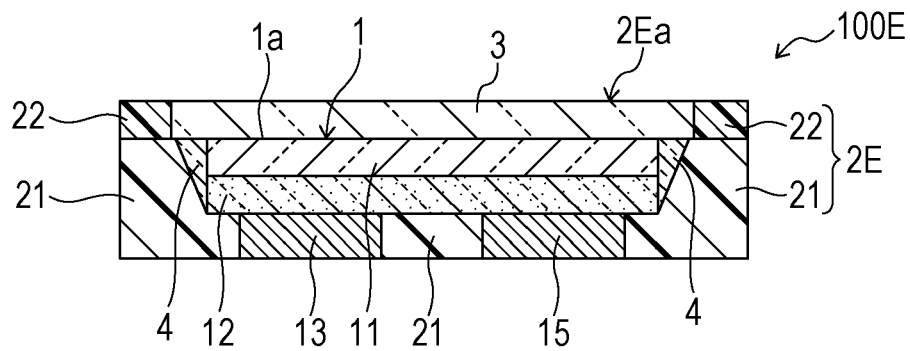
FIG. 7B is a schematic cross-sectional view taken along line VIIB-VIIB in FIG. 7A, which illustrates a configuration of the light emitting device according to the second embodiment.

With reference to FIGS. 7A and 7B, description will be given of a configuration of a light emitting device according to a second embodiment.

A light emitting device 100E according to this embodiment has substantially cuboidal outer shape and has a roughly rectangular shape having a horizontally long side in planar view. The light emitting device 100E according to this embodiment differs from the light emitting device 100 according to the first embodiment in that a light emitting element 1 has the different shape in planar view, and a light-blocking member 2E is provided instead of the light-blocking member 2.

An upper surface of the light emitting device 100E serves as a light extraction surface, and light emitted from the light emitting element 1 is extracted to the outside through a first light-transmissive member 3. Furthermore, a lower surface of the light emitting device 100E serves as a mounting surface in which lower surfaces of a pair of pad electrodes of the light emitting element 1, that is, an n-side electrode 13 and a p-side electrode 15 are exposed as connection terminals.

Other configurations are roughly similar to the above configuration except for a difference accompanied by the difference in outer shape, so that the detailed description is appropriately omitted.

The outer shape of the light emitting element 1 in planar view in the light emitting device 100E is the roughly rectangular shape as described above, but it may be a polygonal shape such as triangle, square, another rectangle, hexagon, or octagon, a circular shape, or an elliptical shape.

The first light-transmissive member 3 in this embodiment covers an upper surface of the light emitting element 1 and an upper surface of a second light-transmissive member 4 and its region is larger than a region of the upper surfaces in planar view, but the region may be equal to the region of the upper surface of the light emitting element 1 and the upper surface of the second light-transmissive member 4 similar to the first embodiment, or may be smaller than that region.

The light-blocking member 2E in this embodiment has a laminated structure of a first light-blocking member 21 and a second light-blocking member 22. The first light-blocking member 21 as a lower layer portion covers the side surface of the second light-transmissive member 4, and the second light-blocking member 22 as an upper layer portion covers the side surface of the first light-transmissive member 3. Although detailed description will be given below, the first light-blocking member 21 and the second light-blocking member 22 are formed in different steps, but they are preferably formed to be integrated with each other with the same resin material.

The light emitting device 100E according to this embodiment is operated similarly to the light emitting device 100 according to the first embodiment, so that detailed description of the operation is omitted.

Method for Manufacturing Light Emitting Device

Figure 8:
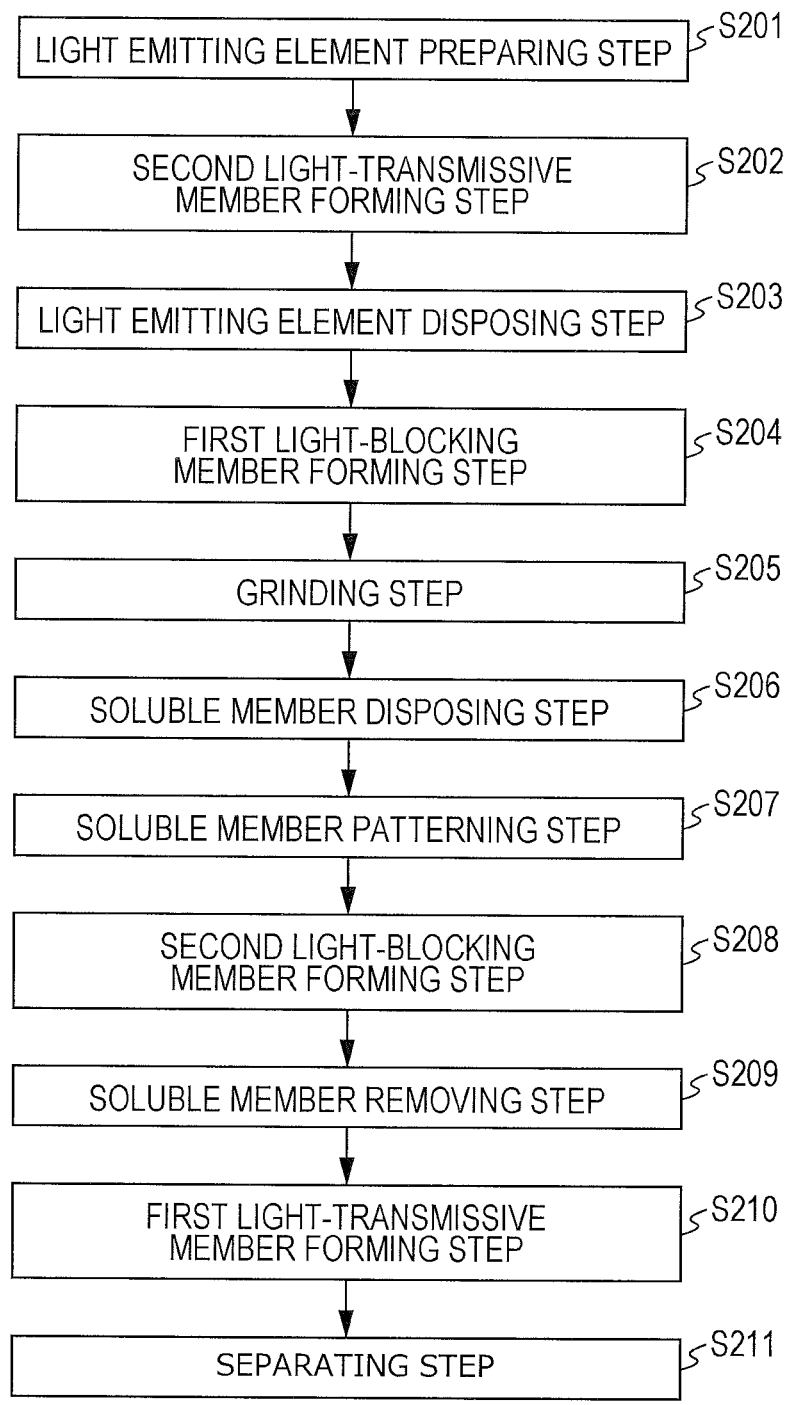
FIG. 8 is a schematic flowchart illustrating a procedure of a method for manufacturing the light emitting device according to the second embodiment.
Figure 9A:
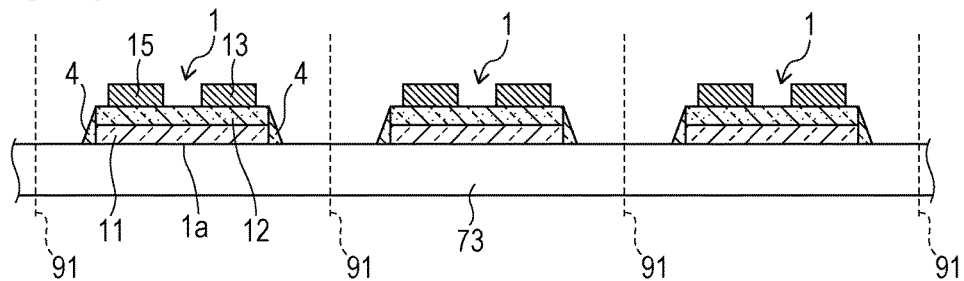
FIG. 9A is a schematic cross-sectional view illustrating a second light-transmissive member forming step of the method for manufacturing the light emitting device according to the second embodiment.
Figure 9B:
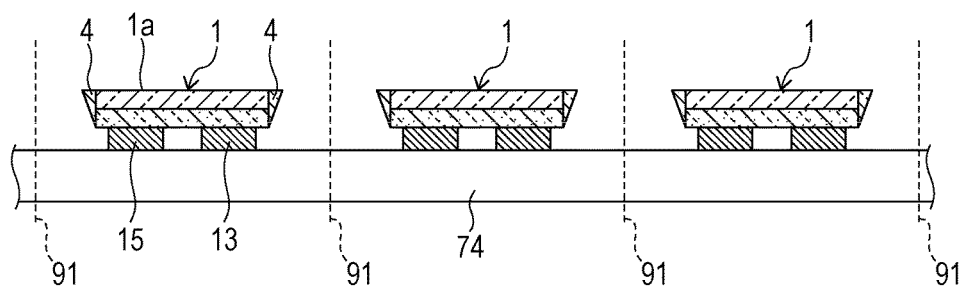
FIG. 9B is a schematic cross-sectional view illustrating a light emitting element disposing step of the method for manufacturing the light emitting device according to the second embodiment.
Figure 9C:
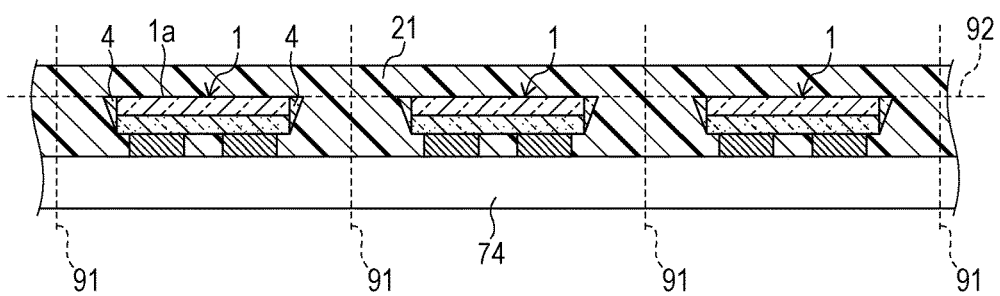
FIG. 9C is a schematic cross-sectional view illustrating a first light-blocking member forming step of the method for manufacturing the light emitting device according to the second embodiment.
Figure 9D:
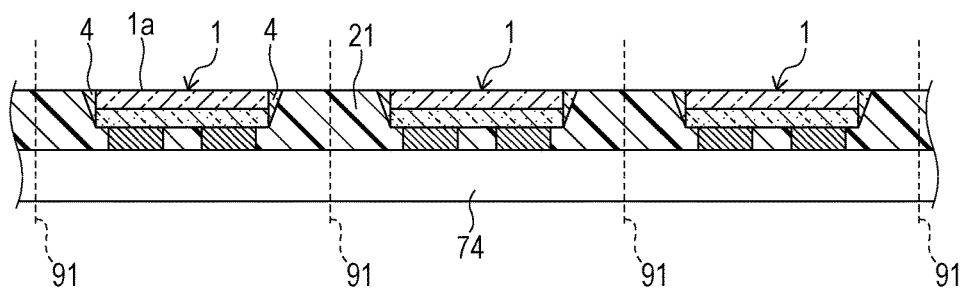
FIG. 9D is a schematic cross-sectional view illustrating a grinding step of the method for manufacturing the light emitting device according to the second embodiment.
Figure 9E:
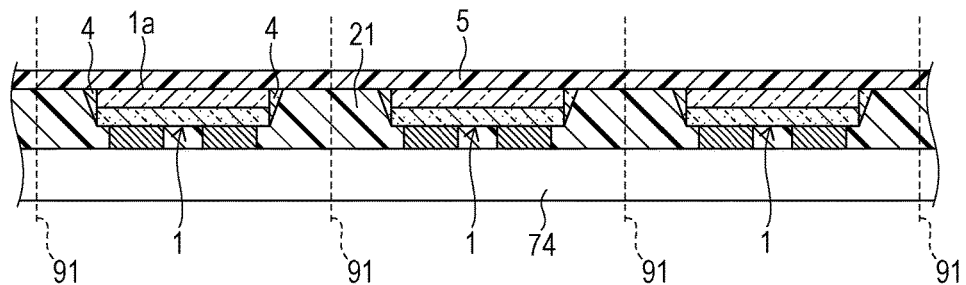
FIG. 9E is a schematic cross-sectional view illustrating a soluble member disposing step of the method for manufacturing the light emitting device according to the second embodiment.
Figure 9F:
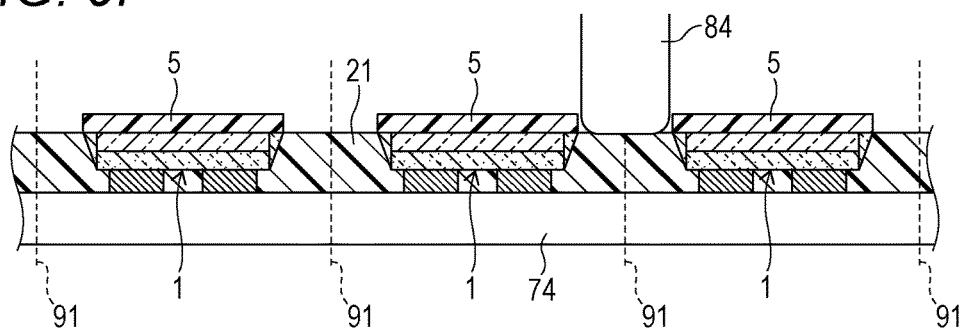
FIG. 9F is a schematic cross-sectional view illustrating a soluble member patterning step of the method for manufacturing the light emitting device according to the second embodiment.
Figure 9G:
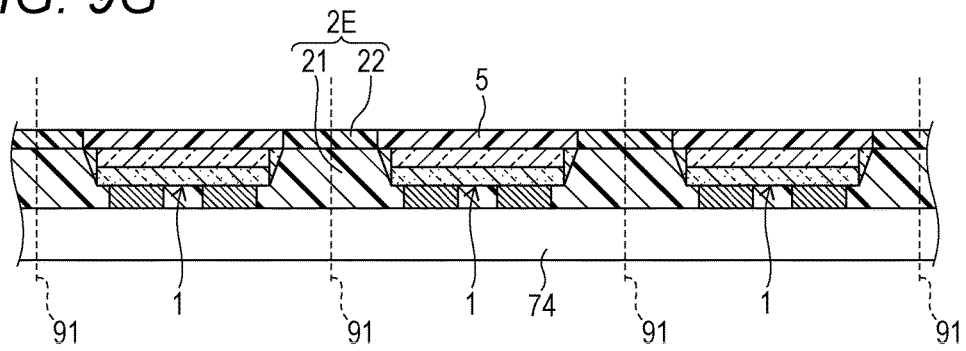
FIG. 9G is a schematic cross-sectional view illustrating a second light-blocking member forming step of the method for manufacturing the light emitting device according to the second embodiment.
Figure 9H:
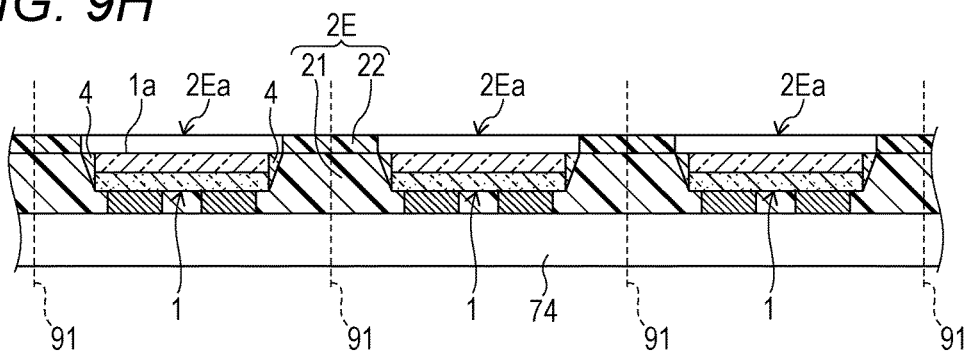
Figure 9I:
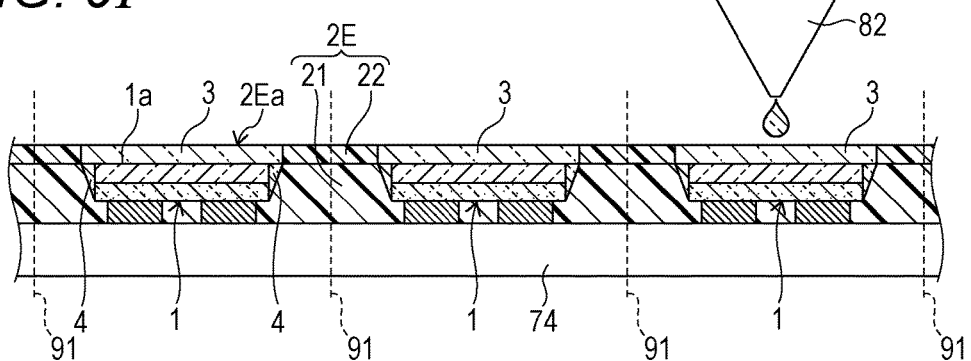
Figure 9J:
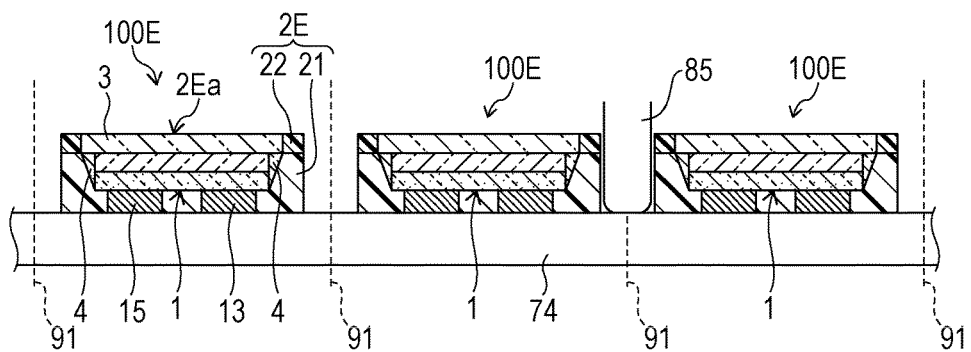
FIG. 9J is a schematic cross-sectional view illustrating a singulating step of the method for manufacturing the light emitting device according to the second embodiment.

With reference to FIGS. 8 to 9J, next, description will be given of a method for manufacturing the light emitting device 100E according to the second embodiment.

The method for manufacturing the light emitting device 100E includes a light emitting element preparing step S201, a second light-transmissive member forming step S202, a light emitting element disposing step S203, a first light-blocking member forming step S204, a grinding step S205, a soluble member disposing step S206, a soluble member patterning step S207, a second light-blocking member forming step S208, a soluble member removing step S209, a first light-transmissive member forming step S210, and a separating step S211.

The light emitting element preparing step S201 is performed similarly to the light emitting element preparing step S101 in the first embodiment, so that the detailed description thereof is omitted.

Next, in the second light-transmissive member forming step S202, the second light-transmissive member 4 is formed on a side surface of the light emitting element 1. This step is performed similarly to the light emitting element disposing step S103 and the second light-transmissive member forming step S104 in the first embodiment. That is, as illustrated in FIG. 9A, the light emitting element 1 is disposed on a sheet-like or plate-like support member 73 with an electrode-forming surface having the n-side electrode 13 and the p-side electrode 15 directed upward, and then the second light-transmissive member 4 is formed of a light-transmissive resin material to cover the side surface of the light emitting element 1.

In the second embodiment also, the plurality of light emitting devices 100E are collectively manufactured, so that the description will be given assuming that the plurality of light emitting elements 1 are disposed at predetermined intervals with the side surfaces exposed.

Furthermore, it is preferable that the disposed light emitting element 1 is fixed with the support member 73 having an adhesive upper surface or with a bonding agent so that it is not displaced. Furthermore, instead of or in addition to the adhesive support member 73, the second light-transmissive member 4 may be formed by substantially the same method as that illustrated in FIGS. 5A and 5B in the modification of the first embodiment.

Furthermore, while the support member 73 may be similar to the above-described support member 71, the support member 73 is preferably flexible so that it can be easily removed from the light emitting element 1 after the second light-transmissive member 4 has been formed.

Subsequently, in the light emitting element disposing step S203, as illustrated in FIG. 9B, the light emitting element 1 having the second light-transmissive member 4 on its side surface is disposed and flip-chip mounted on a support member 74 with the electrode-forming surface directed downward. At this time, the light emitting elements 1 having the second light-transmissive members 4 are disposed and spaced from each other at predetermined intervals with the side surfaces of the second light-transmissive members 4 exposed.

The support member 74 may be in the form of a sheet or a plate similar to the above-described support member 72. Furthermore, the support member 74 may be a mounting substrate to mount the light emitting element 1. In this case, the light emitting element 1 is flip-chip mounted on the support member 74 serving as the mounting substrate.

In addition, in the case where the support member 74 is not the mounting substrate, the support member 74 preferably has the adhesive upper surface to prevent the disposed light emitting element 1 from being displaced, but instead of this, the light emitting element 1 and the support member 74 may be bonded together by a die bonder with a white resin serving as a bonding agent. The white resin used as the bonding agent is preferably the same as the resin material for the first light-blocking member 21. Thus, the first light-blocking member 21 and the bonding agent are integrated with each other to form a light reflective film that covers the lower surface and side surface of the light emitting element 1.

Furthermore, in the case where the mounting substrate is used as the support member 74, the light emitting element 1 may be mounted with an anisotropic electrically-conductive bonding agent containing particles of a light-reflective substance.

The second light-transmissive member forming step S202 may be performed after the light emitting element disposing step S203. That is, the light emitting element 1 is flip-chip mounted on the support member 74, and then the second light-transmissive member 4 is formed on the side surface of the light emitting element 1. In this case, the second light-transmissive member 4 may be formed by applying the light-transmissive resin onto the side surface of the light emitting element 1, or may be formed by filling the light-transmissive resin in a die or a frame by use of a masking tape.

Still furthermore, the step of forming the second light-transmissive member 4 can be omitted.

Subsequently, in the first light-blocking member forming step (the step of forming the first light-blocking member) S204, as illustrated in FIG. 9C, the first light-blocking member 21 is formed to cover the side surface of the light emitting element 1 with the second light-transmissive member 4 interposed between the first light-blocking member 21 and the light emitting element 1. The first light-blocking member 21 may be formed with a white resin or a black resin by a method such as transfer molding, similar to the light-blocking member 2 in the first embodiment. At this time, the first light-blocking member 21 is formed up to a height equal to or more than the upper surface, that is, the light extraction surface 1a of the light emitting element 1.

Subsequently, in the grinding step S205, the upper surface of the first light-blocking member 21 is ground and removed up to a height of a grinding line 92 illustrated in FIG. 9C. Here, the height of the grinding line 92 is equal to a height of the upper surface of the light emitting element 1. Thus, as illustrated in FIG. 9D, the upper surface of the light emitting element 1 and the upper surface of the second light-transmissive member 4 are exposed.

In addition, in the first light-blocking member forming step S204, when the first light-blocking member 21 is formed up to substantially the same height as the upper surface of the light emitting element 1, and the upper surface of the light emitting element 1 and the upper surface of the second light-transmissive member 4 are exposed, the grinding step S205 can be omitted.

Subsequently, in the soluble member disposing step (the step of providing the soluble member) S206, as illustrated in FIG. 9E, the soluble member 5 having a predetermined thickness is applied to cover the entire upper surface of the wafer including the upper surface of the light emitting element 1 and the upper surface of the second light-transmissive member 4. The soluble member 5 in this embodiment may be the same as the soluble member 5 in the first embodiment and may be disposed by the same method as that in the soluble member disposing step S102 in the first embodiment.

Subsequently, in the soluble member patterning step S207, as illustrated in FIG. 9F, similar to the soluble member patterning step S105 in the first embodiment, the soluble member 5 provided in a region having a predetermined width along the border line 91 is removed with a dicer 84, and the soluble member 5 is patterned into a predetermined shape.

At this time, the first light-blocking member 21 may be cut and removed partially or entirely in the thickness direction by the dicer 84. The portion in which the first light-blocking member 21 is removed away may be filled with the white resin or the black resin to form the second light-blocking member 22 in the second light-blocking member forming step S208.

When the soluble member 5 has photosensitivity, the soluble member 5 may be patterned by a photolithography method.

In the soluble member disposing step S206, the soluble member 5 may be previously formed into the predetermined shape and then may be disposed on the upper surface of the light emitting element 1 and the upper surface of the second light-transmissive member 4. In this case, the soluble member patterning step S207 can be omitted.

Subsequently, in the second light-blocking member forming step (the step of forming the second light-blocking member) S208, as illustrated in FIG. 9G, the second light-blocking member 22 is formed on the upper surface of the first light-blocking member 21 to cover the side surface of the soluble member 5. The second light-blocking member 22 is preferably made of the same resin material as the first light-blocking member 21. Thus, the first light-blocking member 21 and the second light-blocking member can be favorably adhered, so that the substantially integrated light-blocking member 2E can be formed.

The second light-blocking member 22 may be formed by a method such as transfer molding or screen printing.

The second light-blocking member 22 is preferably formed such that the upper surface of the soluble member 5 is level with the upper surface of the second light-blocking member 22. Thus, depth precision of the recess portion 2a can be determined by thickness precision of the soluble member 5.

Alternatively, the second light-blocking member 22 may be formed such that its upper surface is higher than the soluble member 5, and then the upper surface is ground to be the same level. In this case, the depth precision of the recess portion 2a is determined by precision of a grinding process.

Subsequently, in the soluble member removing step (the step of forming the recess portion) S209, as illustrated in FIG. 9H, the soluble member is dissolved and removed with the predetermined solvent appropriate to its material. Thus, a recess portion 2Ea is formed in which its bottom surface is defined by the upper surface, that is, the light extraction surface 1a of the light emitting element 1 and the upper surface, that is, the expanded light extraction surface of the second light-transmissive member 4, and its inner surface is defined by the second light-blocking member 22.

Subsequently, in the first light-transmissive member forming step (the step of forming the first light-transmissive member) S210, as illustrated in FIG. 9I, the first light-transmissive member 3 is formed in the recess portion 2Ea similarly to the first light-transmissive member forming step S109 in the first embodiment.

Subsequently, in the separating step S211, as illustrated in FIG. 9J, the light emitting device 100E is separated with a predetermined width spaced by cutting with a dicer 85 along the border line 91, similarly to the separated step S110 in the first embodiment.

After that, the light emitting device 100E is removed from the support member 74, whereby the singulated light emitting devices 100E are provided.

In addition, in the case where the support member 74 is the mounting substrate to mount the light emitting element 1, the support member 74 is also cut with the dicer 85 to singulate the light emitting device 100E having the mounting substrate.

In the above, the method for manufacturing the light emitting device according to this disclosure has been specifically described by way of the embodiment, but the scope of the invention is not limited to the above description and should be widely interpreted based on claims. Furthermore, various modifications and variations made based on the above description are included in the scope of the invention as a matter of course.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a light emitting device, comprising:

providing a first support member;
providing a soluble member on the first support member such that a second surface of the soluble member directly contacts the first support member, the soluble member being soluble in a solvent and having a first surface opposite to the second surface;
providing a light emitting element on the first surface of the soluble member, the light emitting element having a light emitting surface from which the light emitting element is configured to emit light in a light emitting direction, a bottom surface opposite to the light emitting surface in the light emitting direction, and a light emitting element outer peripheral side surface provided between the light emitting surface and the bottom surface, the light emitting surface contacting the first surface of the soluble member;
providing a second light-transmissive member on the first surface of the soluble member to cover the light emitting element outer peripheral side surface, the second light-transmissive member having a first side surface contacting the light emitting element outer peripheral side surface, a second light-transmissive member upper surface facing toward the light emitting direction and contacting the first surface of the soluble member, and a second side surface connecting the first side surface and the second light-transmissive member upper surface, the soluble member including a peripheral portion surrounding a periphery of the second light-transmissive member upper surface when viewed in the light emitting direction;
removing the peripheral portion of the soluble member to provide a soluble member outer peripheral side surface provided between the first surface and the second surface of the soluble member;
providing a light-blocking member made of a material which is not soluble in the solvent to cover the second side surface of the second light-transmissive member and the soluble member outer peripheral side surface so that an inner side wall of the light-blocking member contacts the soluble member outer peripheral side surface and the second side surface of the second light-transmissive member;
removing the first support member from the soluble member after the light-blocking member is provided;
removing the soluble member using the solvent to provide a recess surrounded by the inner side wall of the light-blocking member; and
providing a first light-transmissive member in the recess.

2. The method according to claim 1,
wherein slurry of a liquid resin containing dispersed particles of a wavelength conversion substance is dropped in the recess and cured to provide the first light-transmissive member.

3. The method according to claim 2,
wherein the wavelength conversion substance includes KSF florescent material.

4. The method according to claim 1,
wherein the solvent comprises at least one of acetone, methyl ethyl ketone, another ketone-based organic solvent and water.

5. The method according to claim 1,
wherein a shape of the recess is a rectangular shape when viewed in a direction opposite to the light emitting direction.

6. The method according to claim 1,
wherein the second side surface is inclined toward the first side surface.

7. The method according to claim 1,
wherein the second light-transmissive member is made of resin.

8. The method according to claim 1, further comprising:
providing a second support member on the light emitting element such that the bottom surface of the light emitting element faces the second support member after the first support member is removed and before the soluble member is removed.

9. The method according to claim 1,
wherein the first support member has a support member peripheral portion overlapping with the peripheral portion of the soluble member when viewed in the light emitting direction,
wherein the support member peripheral portion of the first support member is not removed when the peripheral portion of the soluble member is removed, and
wherein the removing the first support member further includes removing the first support member from the light-blocking member after the light-blocking member is provided.

10. The method according to claim 1,
wherein a first electrode and a second electrode are provided on the bottom surface of the light emitting element,
wherein each of the first electrode and the second electrode comprises
an electrode top surface contacting the bottom surface of the light emitting element,
an electrode bottom surface opposite to the electrode top surface in a direction opposite to the light emitting direction, and
an electrode side surface provided between the electrode top surface and the electrode bottom surface, and
wherein the light-blocking member is provided to cover the electrode side surface of each of the first electrode and the second electrode.

* * * * *